US008159070B2

(12) United States Patent
Lin et al.

(10) Patent No.: US 8,159,070 B2
(45) Date of Patent: Apr. 17, 2012

(54) CHIP PACKAGES

(75) Inventors: Mou-Shiung Lin, Hsin-Chu (TW); Jin-Yuan Lee, Hsin-Chu (TW)

(73) Assignee: Megica Corporation, Hsinchu (TW)

( * ) Notice: Subject to any disclaimer, the term of this patent is extended or adjusted under 35 U.S.C. 154(b) by 89 days.

(21) Appl. No.: 12/748,295

(22) Filed: Mar. 26, 2010

(65) Prior Publication Data
US 2010/0244263 A1 Sep. 30, 2010

Related U.S. Application Data

(60) Provisional application No. 61/164,914, filed on Mar. 31, 2009.

(51) Int. Cl.
*H01L 23/48* (2006.01)

(52) U.S. Cl. ............... 257/758; 257/E23.142; 257/750; 257/775

(58) Field of Classification Search .......... 257/751, 257/753, 780, 781, 784, 786, 750, 758, 774, 257/775, E23.142
See application file for complete search history.

(56) References Cited

U.S. PATENT DOCUMENTS

| 5,576,680 | A | 11/1996 | Ling |
| 6,008,102 | A | 12/1999 | Alford et al. |
| 2007/0252281 | A1* | 11/2007 | Lin et al. ............ 257/762 |
| 2008/0042273 | A1* | 2/2008 | Lin ..................... 257/737 |

OTHER PUBLICATIONS

PCT International Search Report and Written Opinion for International Application No. PCT/US2010/029066 by the International Searching Authority, dated May 21, 2010.

Mistry, K. et al. "A 45nm Logic Technology with High-k+ Metal Gate Transistors, Strained Silicon, 9 Cu Interconnect Layers, 193nm Dry Patterning, and 100% Pb-free Packaging," IEEE International Electron Devices Meeting (2007) pp. 247-250.

Edelstein, D.C., "Advantages of Copper Interconnects," Proceedings of the 12th International IEEE VLSI Multilevel Interconnection Conference (1995) pp. 301-307.

Theng, C. et al. "An Automated Tool Deployment for ESD (Electro-Static-Discharge) Correct-by-Construction Strategy in 90 nm Process," IEEE International Conference on Semiconductor Electronics (2004) pp. 61-67.

Gao, X. et al. "An improved electrostatic discharge protection structure for reducing triggering voltage and parasitic capacitance," Solid-State Electronics, 27 (2003), pp. 1105-1110.

Yeoh, A. et al. "Copper Die Bumps (First Level Interconnect) and Low-K Dielectrics in 65nm High Volume Manufacturing," Electronic Components and Technology Conference (2006) pp. 1611-1615.

(Continued)

*Primary Examiner* — Jasmine Clark
(74) *Attorney, Agent, or Firm* — McDermott Will & Emery LLP

(57) ABSTRACT

Chip assemblies are disclosed that include a semiconductor substrate, multiple devices in and on the semiconductor substrate, a first metallization structure over the semiconductor substrate, and a passivation layer over the first metallization structure. First and second openings in the passivation layer expose first and second contact pads of the first metallization structure. A first metal post is positioned over the passivation layer and over the first contact pad. A second metal post is positioned over the passivation layer and over the second contact pad. A polymer layer is positioned over the passivation layer and encloses the first and second metal posts. A second metallization structure is positioned on the polymer layer, on the top surface of the first metal post and on the top surface of second metal post. The second metallization structure includes an electroplated metal. Related fabrication methods are also described.

12 Claims, 17 Drawing Sheets

OTHER PUBLICATIONS

Hu, C-K. et al. "Copper-Polyimide Wiring Technology for VLSI Circuits," Materials Research Society Symposium Proceedings VLSI V (1990) pp. 369-373.

Roesch, W. et al. "Cycling copper flip chip interconnects," Microelectronics Reliability, 44 (2004) pp. 1047-1054.

Lee, Y-H. et al. "Effect of ESD Layout on the Assembly Yield and Reliability," International Electron Devices Meeting (2006) pp. 1-4.

Yeoh, T-S. "ESD Effects on Power Supply Clamps," Proceedings of the 6th International Symposium on Physical & Failure Analysis of Integrated Circuits (1997) pp. 121-124.

Edelstein, D. et al. "Full Copper Wiring in a Sub-0.25 pm CMOS ULSI Technology," Technical Digest IEEE International Electron Devices Meeting (1997) pp. 773-776.

Venkatesan, S. et al. "A High Performance 1.8V, 0.20 pm CMOS Technology with Copper Metallization," Technical Digest IEEE International Electron Devices Meeting (1997) pp. 769-772.

Jenei, S. et al. "High Q Inductor Add-on Module in Thick Cu/SiLK™ single damascene," Proceedings from the IEEE International Interconnect Technology Conference (2001) pp. 107-109.

Groves, R. et al. "High Q Inductors in a SiGe BiCMOS Process Utilizing a Thick Metal Process Add-on Module," Proceedings of the Bipolar/BiCMOS Circuits and Technology Meeting (1999) pp. 149-152.

Sakran, N. et al. "The Implementation of the 65nm Dual-Core 64b Merom Processor," IEEE International Solid-State Circuits Conference, Session 5, Microprocessors, 5.6 (2007) pp. 106-107, p. 590.

Kumar, R. et al. "A Family of 45nm IA Processors," IEEE International Solid-State Circuits Conference, Session 3, Microprocessor Technologies, 3.2 (2009) pp. 58-59.

Bohr, M. "The New Era of Scaling in an SoC World," International Solid-State Circuits Conference (2009) Presentation Slides 1-66.

Bohr, M. "The New Era of Scaling in an SoC World," International Solid-State Circuits Conference (2009) pp. 23-28.

Ingerly, D. et al. "Low-K Interconnect Stack with Thick Metal 9 Redistribution Layer and Cu Die Bump for 45nm High Volume Manufacturing," International Interconnect Technology Conference (2008) pp. 216-218.

Kurd, N. et al. "Next Generation Intel® Micro-architecture (Nehalem) Clocking Architecture," Symposium on VLSI Circuits Digest of Technical Papers (2008) pp. 62-63.

Maloney, T. et al. "Novel Clamp Circuits for IC Power Supply Protection," IEEE Transactions on Components, Packaging, and Manufacturing Technology, Part C, vol. 19, No. 3 (Jul. 1996) pp. 150-161.

Geffken, R. M. "An Overview of Polyimide Use in Integrated Circuits and Packaging," Proceedings of the Third International Symposium on Ultra Large Scale Integration Science and Technology (1991) pp. 667-677.

Luther, B. et al. "Planar Copper-Polyimide Back End of the Line Interconnections for ULSI Devices," Proceedings of the 10th International IEEE VLSI Multilevel Interconnection Conference (1993) pp. 15-21.

Master, R. et al. "Ceramic Mini-Ball Grid Array Package for High Speed Device," Proceedings from the 45th Electronic Components and Technology Conference (1995) pp. 46-50.

Maloney, T. et al. "Stacked PMOS Clamps for High Voltage Power Supply Protection," Electrical Overstress/Electrostatic Discharge Symposium Proceedings (1999) pp. 70-77.

Lin, M.S. et al. "A New System-on-a-Chip (SOC) Technology—High Q Post Passivation Inductors," Proceedings from the 53rd Electronic Components and Technology Conference (May 30, 2003) pp. 1503-1509.

MEGIC CORP. "MEGIC way to system solutions through bumping and redistribution," (Brochure) (Feb. 6, 2004) pp. 1-3.

Lin, M.S. "Post Passivation Technology™—MEGIC® Way to System Solutions," Presentation given at TSMC Technology Symposium, Japan (Oct. 1, 2003) pp. 1-32.

Lin, M.S. et al. "A New IC Interconnection Scheme and Design Architecture for High Performance ICs at Very Low Fabrication Cost—Post Passivation Interconnection," Proceedings of the IEEE Custom Integrated Circuits Conference (Sep. 24, 2003) pp. 533-536.

* cited by examiner

CHIP PACKAGES

This application claims priority to U.S. provisional application No. 61/164,914, filed on Mar. 31, 2009, which is herein incorporated by reference in its entirety.

BACKGROUND OF THE DISCLOSURE

1. Field of the Disclosure

The present disclosure relates to chip packages, and, more specifically, to chip packages including a fine-pitched chip having a metal post preformed on the fine-pitched chip for improved electrical performance.

2. Brief Description of the Related Art

Semiconductor wafers are processed to produce IC (integrated circuit) chips having ever-increasing device density and shrinking feature geometries. Multiple conductive and insulating layers are required to enable the interconnection and isolation of the large number of semiconductor devices in different layers (e.g., active and passive devices, such as TFT, CMOS, capacitors, inductors, resistors, etc). Such large scale integration results in an increasing number of electrical connections between various layers and semiconductor devices. It also leads to an increasing number of leads to the resultant IC chip. These leads are exposed through a passivation layer of the IC chip, terminating in I/O pads that allow connections to external contact structures in a chip package.

Wafer-Level Packaging (WLP) commonly refers to the technology of packaging an IC chip at wafer level, instead of the traditional process of assembling the package of each individual unit after wafer dicing. WLP allows for the integration of wafer fabrication, packaging, test, and burn-in at the wafer level, before being singulated by dicing for final assembly into a chip carrier package, e.g., a ball grid array (BGA) package. The advantages offered by WLP include smaller size (reduced footprint and thickness), lesser weight, relatively easier assembly process, lower overall production costs, and improvement in electrical performance. WLP therefore streamlines the manufacturing process undergone by a device from silicon start to customer shipment. While WLP is a high throughput and low cost approach to IC chip packaging, it however invites significant challenges in manufacturability and structural reliability.

SUMMARY OF THE DISCLOSURE

Aspects and embodiments of the present disclosure address the shortcomings noted previously by providing chip packages including a fine-pitched chip having one or more metal posts preformed on the fine-pitched chip for improved electrical performance.

Embodiments of the present disclosure provide a chip package including a semiconductor substrate; multiple pads on the semiconductor substrate, multiple metal posts on the multiple pads, a polymer material over the semiconductor substrate and enclosed the metal post, top surfaces of metal posts are exposed, and multiple metal bumps or wirebonding pads on the top surfaces of metal posts.

These, as well as other components, steps, features, benefits, and advantages of the present disclosure, will now become clear from a review of the following detailed description of illustrative embodiments, the accompanying drawings, and the claims.

BRIEF DESCRIPTION OF THE DRAWINGS

The drawings disclose illustrative embodiments. They do not set forth all embodiments. Other embodiments may be used in addition or instead. Details that may be apparent or unnecessary may be omitted to save space or for more effective illustration. Conversely, some embodiments may be practiced without all of the details that are disclosed. When the same numeral appears in different drawings, it refers to the same or like components or steps.

Aspects of the disclosure may be more fully understood from the following description when read together with the accompanying drawings, which are to be regarded as illustrative in nature, and not as limiting. The drawings are not necessarily to scale, emphasis instead being placed on the principles of the disclosure.

FIG. 3b is a cross-sectional view of a variation of the embodiment shown in FIG. 3a.

Figure 1A:
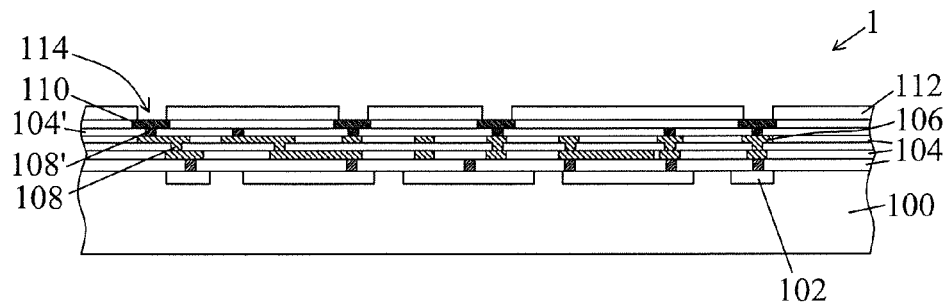
FIGS. 1a-1o are cross-sectional views showing a first embodiment 1 of a process of forming a chip, in accordance with the present disclosure.

While certain embodiments are depicted in the drawings, one skilled in the art will appreciate that the embodiments depicted are illustrative and that variations of those shown, as well as other embodiments described herein, may be envisioned and practiced within the scope of the present disclosure.

DETAILED DESCRIPTION OF THE DISCLOSURE

Illustrative embodiments are now discussed. Other embodiments may be used in addition or instead. Details that may be apparent or unnecessary may be omitted to save space or for a more effective presentation. Conversely, some embodiments may be practiced without all of the details that are disclosed.

Embodiments of the present disclosure are directed to chip packages including a fine-pitched chip having one or more metal posts or pillars preformed on the fine-pitched chip for improved electrical performance. Exemplary embodiments are described below; others may of course be practiced within the scope of the present disclosure.

Embodiment 1

Figure 1B:
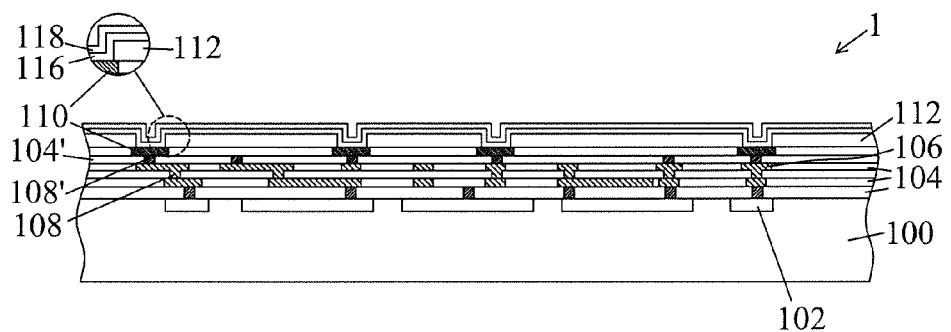
FIG. 1p is a top view of the first embodiment.
FIG. 1q is a top view of a second embodiment, in accordance with the present disclosure.
FIGS. 1r and 1s are top views of a third embodiment, in accordance with the present disclosure.
FIG. 1t is a cross-sectional view showing a final structure of a fourth embodiment, in accordance with the present disclosure.
FIGS. 1u and 1v are top views of the fourth embodiment of FIG. 1t.
FIG. 1w is a cross-sectional view of a fifth embodiment, in accordance with the present disclosure.
FIG. 1x is a cross-sectional view of a sixth embodiment, in accordance with the present disclosure.
FIG. 1y is a cross-sectional view of a seventh embodiment, in accordance with the present disclosure.
Figure 1C:
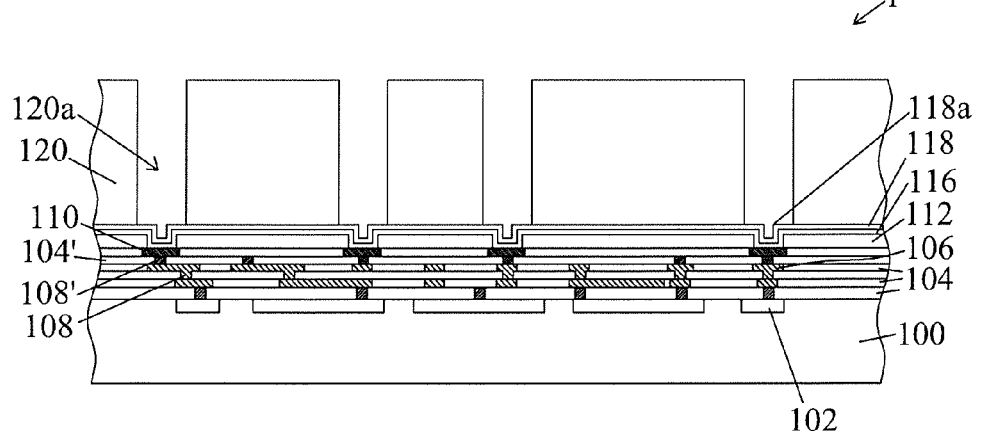
Figure 1D:
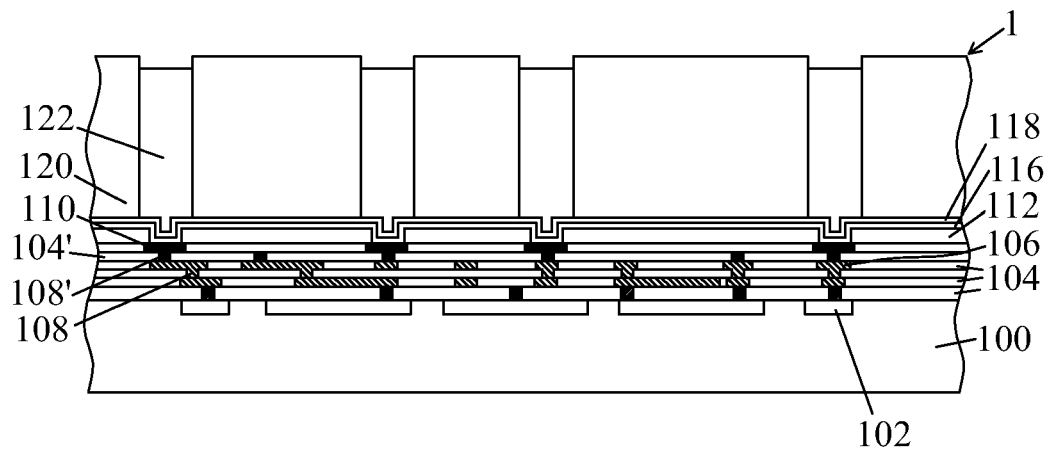
Figure 1E:
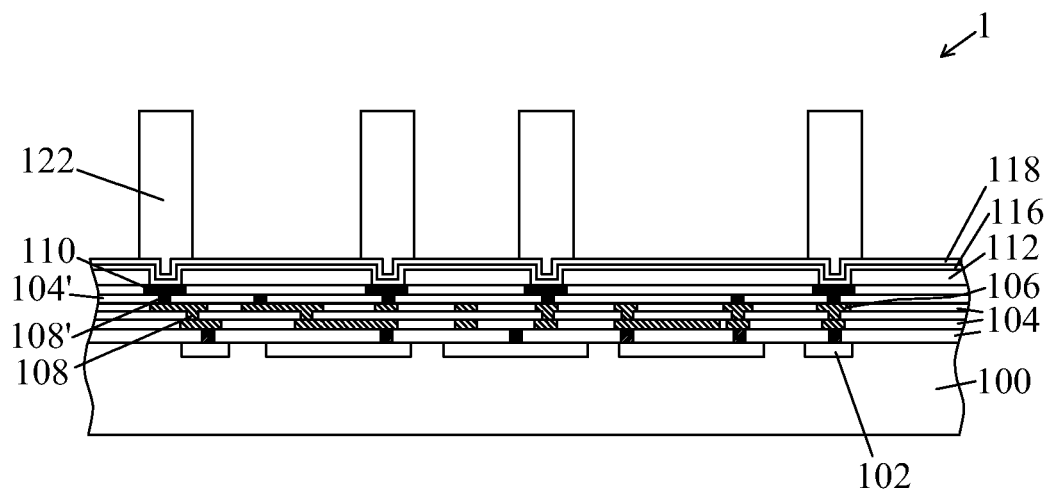
Figure 1F:
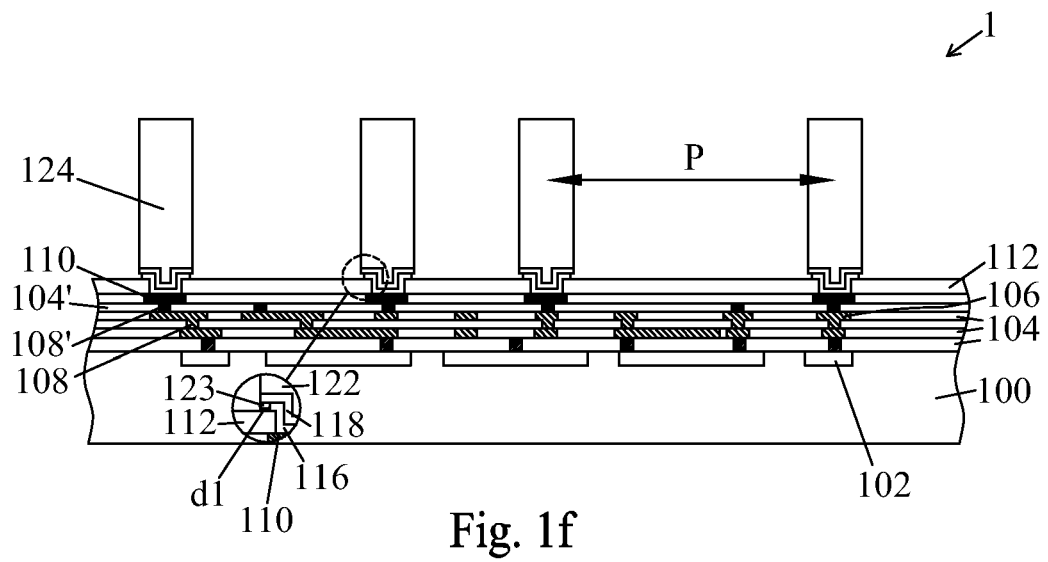
Figure 1G:
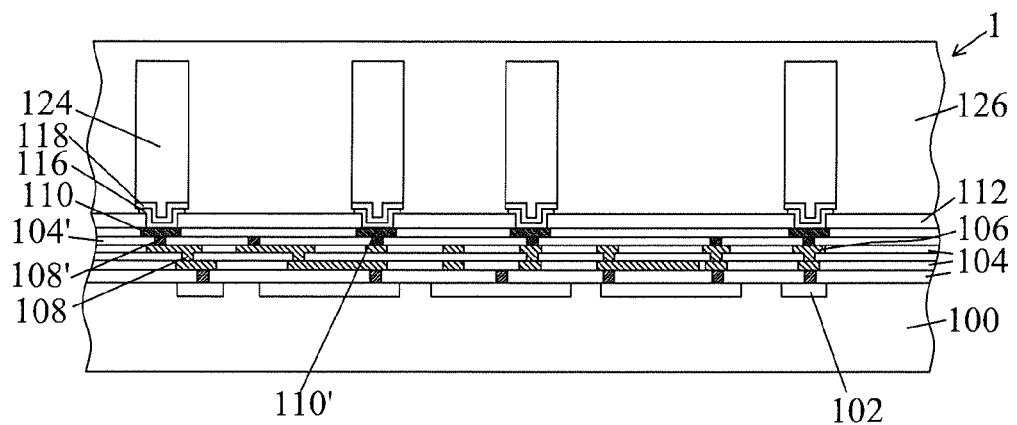
Figure 1H:
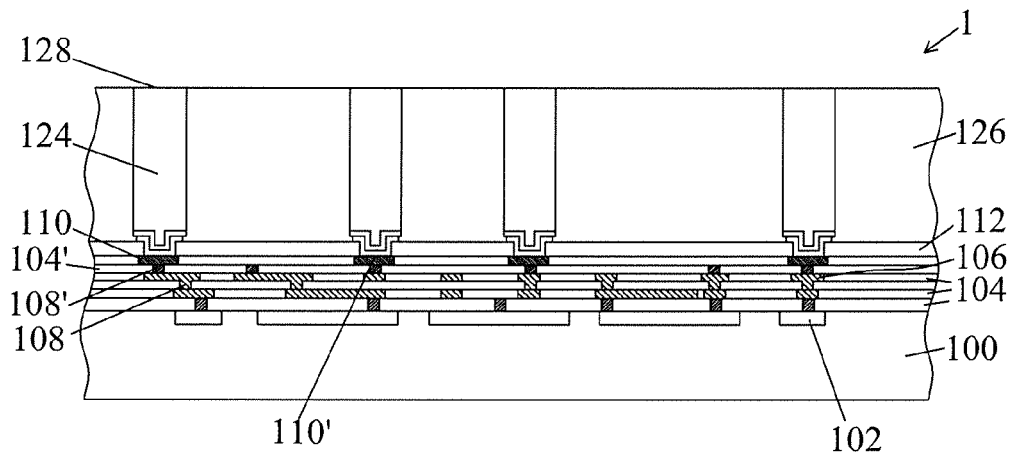
Figure 1I:
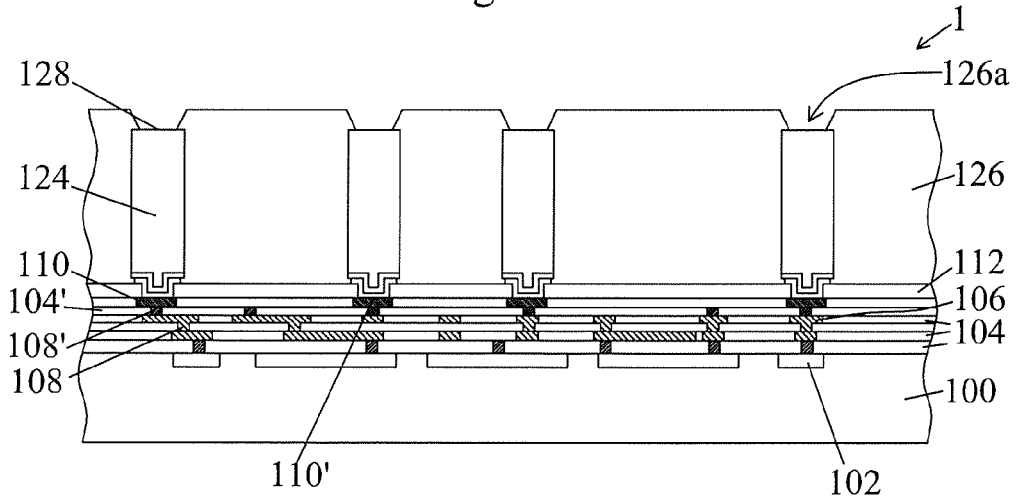
Figure 1J:
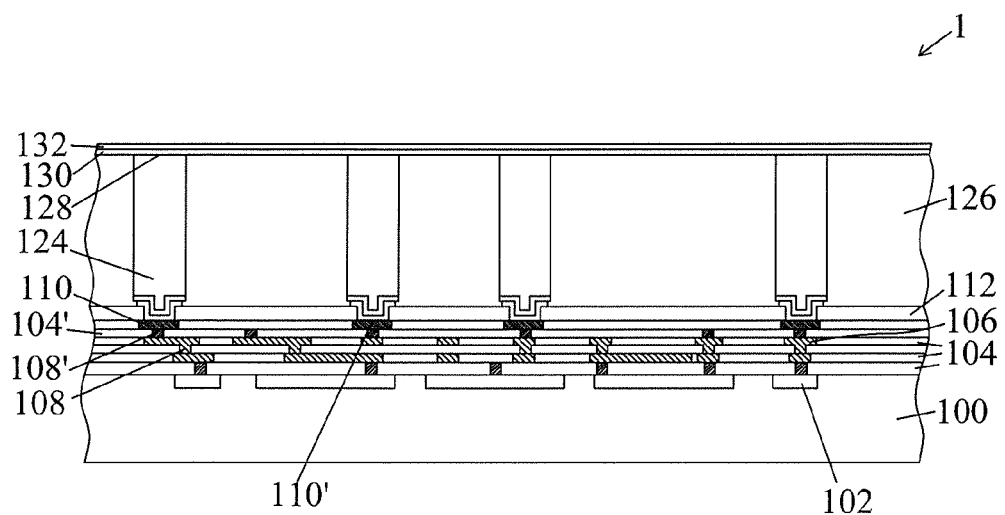
Figure 1K:
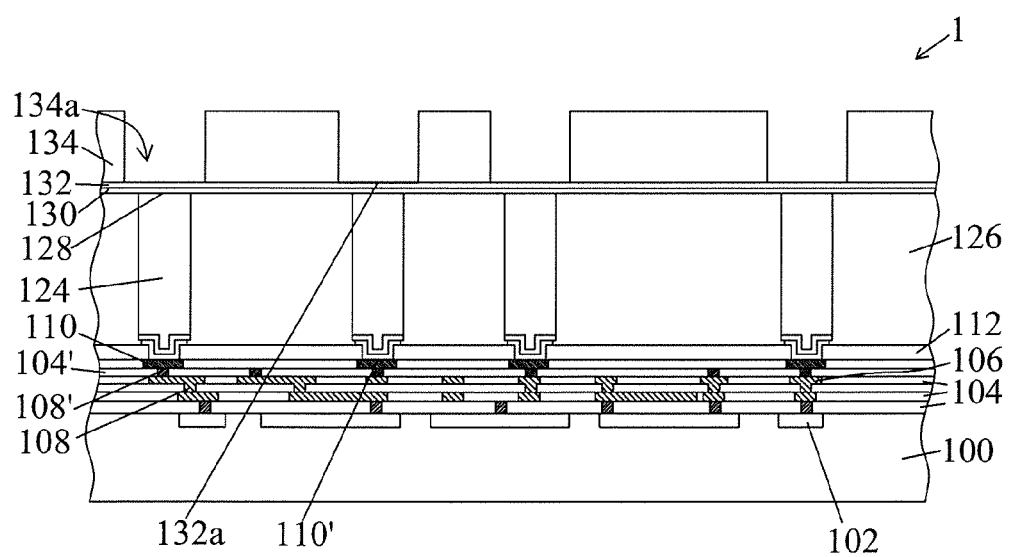
Figure 1L:
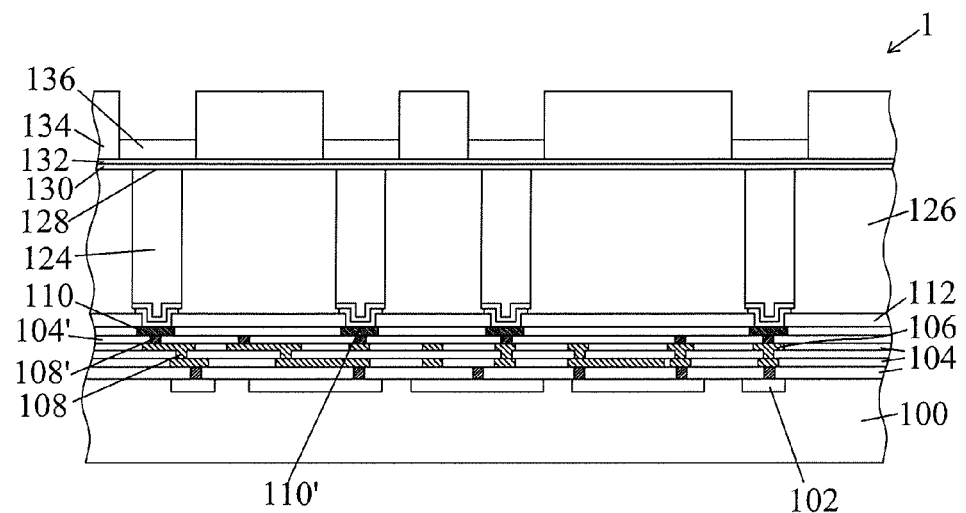
Figure 1M:
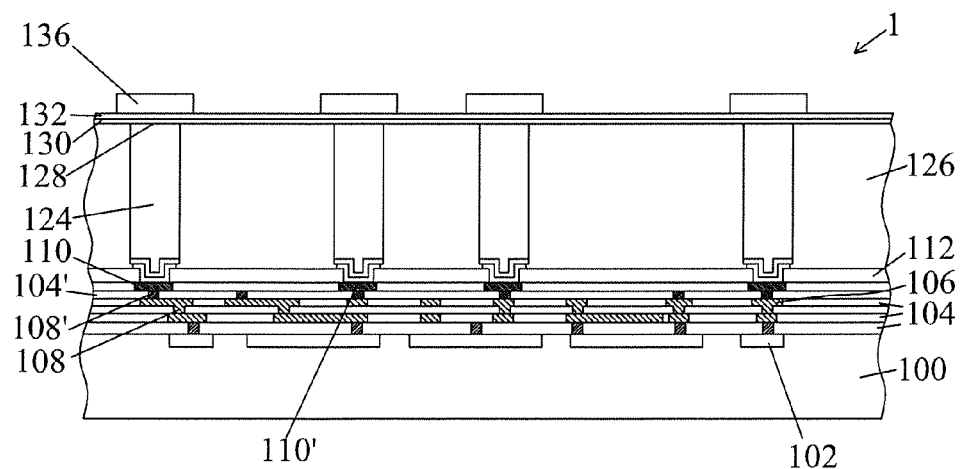
Figure 1N:
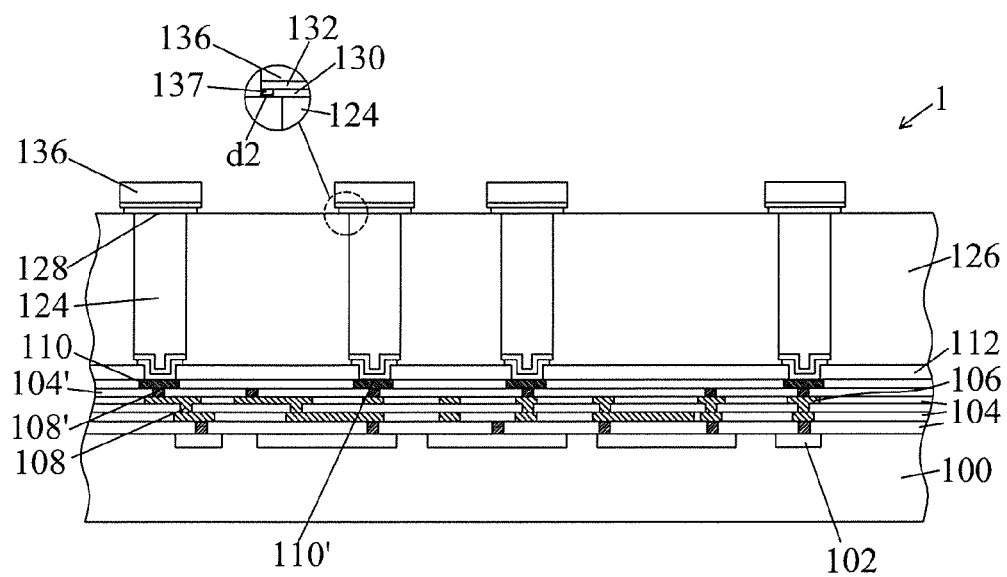
Figure 1O:
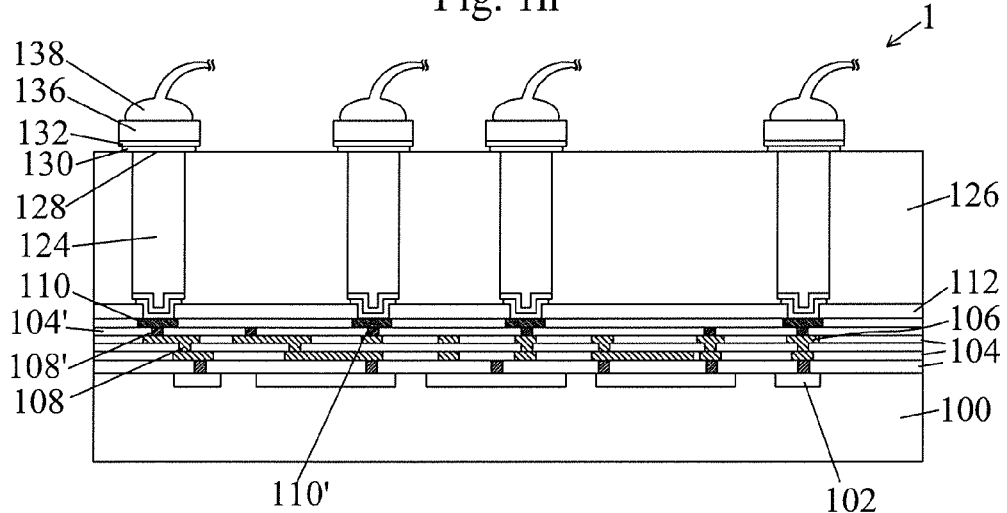
Figure 1P:
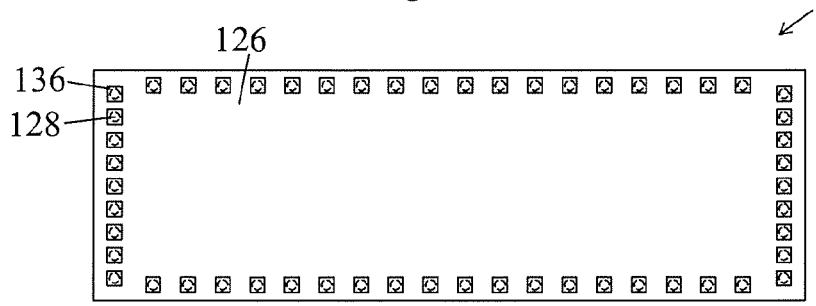

FIGS. 1a-1p illustrate a first exemplary embodiment 1 of the present disclosure. FIGS. 1a-1o are cross-sectional views showing a first embodiment of a process of forming a chip, while FIG. 1p is a top view of the embodiment.

FIG. 1a depicts a substrate (or wafer) 100 made of a type of semiconductor. This substrate 100 can, for example, be silicon based, gallium arsenide (GaAs) based, silicon indium based (SiIn), silicon antimony based (SiSb), indium antimony based (InSb), or silicon germanium (SiGe) based; these types of semiconductor materials/alloys are representative and other types of semiconductors may be used. Devices, such as semiconductor devices 102, can be located in or over substrate 100. For example, these semiconductor devices 102 can be diodes and/or transistors, such as p-channel metal-oxide-semiconductor (MOS) transistor or n-channel metal-oxide-semiconductor transistor, or BiCMOS, or BJT devices, which can be connected to the interconnection layers 106. The semiconductor devices 102 can be provided for and implemented as NOR gates, NAND gates, AND gates, OR gates, flash memory cells, static random access memory (SRAM) cells, dynamic random access memory (DRAM) cells, non-volatile memory cells, erasable programmable read-only memory (EPROM) cells, read-only memory (ROM) cells, magnetic random access memory (MRAM) cells, sense amplifiers, inverters, operational amplifiers, adders, multiplexers, diplexers, multipliers, analog-to-digital (A/D) converters, digital-to-analog (D/A) converters or analog circuits, and the like. Furthermore, the gate of semiconductor devices 102 can be formed of suitable materials, including metal or polysilicon. The gate can be formed by aluminum containing layer or titanium containing layer, in exemplary embodiments. For example, the gate of semiconductor devices 102 can be formed of TiAlN.

As shown in FIG. 1a, a thin circuit structure can be disposed or located on substrate 100. This circuit structure can include multiple dielectric layers 104 and multiple metal layers 106. A dielectric layer 104 can have a suitable thickness, e.g., between 0.3 micrometers and 2.5 micrometers, for exemplary embodiments. The materials that are used to make the first and second dielectric layers can include boron containing silicate glass, silicon-nitride, silicon-oxide, silicon-oxynitride, and carbon containing low-k dielectric materials, for example, though other suitable materials may be used. Other exemplary materials that can be used for a dielectric layer include, but are not limited to: tetraethoxysilane (e.g., TEOS); compounds containing silicon, carbon, oxygen, and hydrogen (such as $Si_wC_xO_yH_z$); fluorinated silicate glass (FSG); Black Diamond; SiLK; porous silicon oxides; porous compounds containing nitrogenm; silicon carbon nitride (such as SiCN); borophosphosilicate glass (BPSG); polyarylene ether; polybenzooxazole (PBO); or, any suitable material having a low dielectric constant (K) in a suitable range, e.g., between 1.5 and 3, or lower.

The metal layers 106 can be connected to the semiconductor devices 102. Each of the metal layers 106 has a suitable thickness, e.g., between 20 nanometers and 2 micrometers, and preferably between 100 nanometers and 1 micrometer. Each of the metal layers 106 may include a metal trace, e.g., having a width less than 1 micrometer, such as between 0.05 and 0.95 micrometers. The material of the metal layers 106 may include, e.g., electroplated copper, aluminum, aluminum-copper alloy, carbon nanotubes or a composite of the previously-described materials.

For example, each of the metal layers 106 may include an electroplated copper layer having a suitable thickness, e.g., between 20 nanometers and 1.5 micrometers, and preferably between 100 nanometers and 1 micrometer, in one of the dielectric layers 104, an adhesion/barrier layer, such as titanium-nitride layer, titanium-tungsten-alloy layer, tantalum-nitride layer, titanium layer or tantalum layer, at a bottom surface and sidewalls of the electroplated copper layer, and a seed layer of copper between the electroplated copper layer and the adhesion/barrier layer. The seed layer of copper can be at the bottom surface and sidewalls of the electroplated copper layer and can be in contact with the bottom surface and sidewalls of the electroplated copper layer. The electroplated copper layer, the seed layer of copper and the adhesion/barrier layer can be formed by a suitable process or processes, such as damascene or double-damascene process including an electroplating process, a sputtering process and a chemical mechanical polishing (CMP) process.

Alternatively, each of the metal layers 106 may include an adhesion/barrier layer on a top surface of one of the dielectric layers 104, a sputtered aluminum or aluminum-copper-alloy layer having a suitable thickness, e.g., between 20 nanometers and 2 micrometers, and preferably between 100 nanometers and 1 micrometer, on a top surface of the adhesion/barrier layer, and an anti-reflection layer on a top surface of the sputtered aluminum or aluminum-copper-alloy layer. The sputtered aluminum or aluminum-copper-alloy layer, the adhesion/barrier layer and the anti-reflection layer can be formed by a suitable process, e.g., including a sputtering process and an etching process. For exemplary embodiments, sidewalls of the sputtered aluminum or aluminum-copper-alloy layer are not covered by the adhesion/barrier layer and the anti-reflection layer. The adhesion/barrier layer and the anti-reflection layer can be formed of suitable materials, e.g., can include a titanium layer, a titanium-nitride layer or a titanium-tungsten layer.

The via plugs 108 can be in the bottommost dielectric layer 104 between the bottommost metal layers 106 and the substrate 100, and connect the metal layers 106 to the semiconductor devices 102. The via plugs 108 may include copper, e.g., formed by an electroplating process, or tungsten, e.g., formed by a process including a chemical vapor deposition (CVD) process and a chemical mechanical polishing (CMP) process.

With continued reference to FIG. 1a, the top via plugs 108' can be in the dielectric layer 104' that has a top surface having the metal traces or pads 110 formed thereon, and the via plugs 108' can connect the metal traces or pads 110 to the metal layers 106. The via plugs 108' may, in exemplary embodiments, include copper formed by an electroplating process or tungsten formed by a process including a chemical vapor deposition (CVD) process and a chemical mechanical polishing (CMP) process or by a process including a sputtering process and a chemical mechanical polishing (CMP) process. The metal traces or pads 110 may, in exemplary embodiments, include aluminum formed by a process including a chemical vapor deposition (CVD) process or include copper formed by an electroplating process. The preceding materials are by way of example, and other materials may be used for the metal traces or pads 110.

A passivation layer 112 can be formed over the circuit structure including the dielectric layer 104, metal layers 106, and metal traces or pads 110. This passivation layer 112 can protect devices 102 and the metal layers 106 described above from humidity and metal ion contamination. In other words, passivation layer 112 can prevent movable ions, such as sodium ions, moisture, transition metal ions, such as gold, silver, and copper, and other impurities from passing through and damaging devices 102, which, e.g., can be MOS devices, n-channel DMOS devices, p-channel DMOS devices, LDMOS, BiCMOS devices, bipolar transistors, or voltage feedback devices, and switch controller, or all of metal layers 106 that are below passivation layer 112. In addition, passivation layer 112, can in exemplary embodiments, consist of silicon-oxide (such as $SiO_2$), phosphosilicate glass (PSG), silicon-nitride (such as $Si_3N_4$), carbon-silicon-nitride, and/or silicon oxynitride. Passivation layer 112 can have a suitable thickness, for example, between 0.3 micrometers and 2 micrometers. When a passivation layer 112 includes a silicon-nitride layer, this silicon-nitride layer preferably, though not necessarily, can have a thickness exceeding 0.3 micrometers and less than 2 micrometers.

Passivation Layer Fabrication—Exemplary Embodiments

Fifteen exemplary methods of manufacturing or fabricating passivation layer 112, are described below. Other suitable methods of manufacturing or fabricating passivation layer 112 may of course be utilized in accordance with the present disclosure.

In a first exemplary method, the passivation layer 112 can be formed by depositing a silicon oxide layer with a thickness of between 0.2 and 1.2 μm using a CVD method and on the silicon oxide layer depositing a silicon nitride layer with thickness between 0.3 and 1.2 μm by using a CVD method.

In a second exemplary method, the passivation layer 112 can be formed by depositing a silicon oxide layer with a thickness of between 0.2 and 1.2 μm using a CVD method, next depositing a silicon oxynitride layer with a thickness of between 0.05 and 0.3 μm on the silicon oxide layer using a Plasma Enhanced CVD (PECVD) method, and then depositing a silicon nitride layer with a thickness of between 0.2 and 1.2 μm on the silicon oxynitride layer using a CVD method.

In a third exemplary method, the passivation layer 112 can be formed by depositing a silicon oxynitride layer with a thickness of between 0.05 and 0.3 μm using a CVD method, next depositing a silicon oxide layer with a thickness of between 0.2 and 1.2 μm on the silicon oxynitride layer using a CVD method, and then depositing a silicon nitride layer with a thickness of between 0.2 and 1.2 μm on the silicon oxide layer using a CVD method.

In a fourth exemplary method, the passivation layer 112 can be formed by depositing a first silicon oxide layer with a thickness of between 0.2 and 0.5 μm using a CVD method, next depositing a second silicon oxide layer with a thickness of between 0.5 and 1 μm on the first silicon oxide layer using a spin-coating method, next depositing a third silicon oxide layer with a thickness of between 0.2 and 0.5 μm on the second silicon oxide layer using a CVD method, and then depositing a silicon nitride layer with a thickness of 0.2 and 1.2 μm on the third silicon oxide using a CVD method.

In a fifth exemplary method, the passivation layer 112 can be formed by depositing a silicon oxide layer, e.g., with a thickness of between 0.5 and 2 μm, using a High Density Plasma CVD (HDP-CVD) method. A silicon nitride layer with a desired thickness, e.g., of 0.2 and 1.2 μm, can be deposited on the silicon oxide layer using a CVD method.

In a sixth exemplary method, the passivation layer 112 can be formed by depositing an undoped silicate glass (USG) layer with a desired thickness, e.g., of between 0.2 and 3 μm. Next, an insulating layer, e.g., of tetraethyl orthosilicate ("TEOS"), phosphosilicate glass ("PSG"), or borophosphosilicate glass ("BPSG"), with a desired thickness, e.g., of between 0.5 and 3 μm, can be deposited on the USG layer. Then, a silicon nitride layer with a desired thickness, e.g., of between 0.2 and 1.2 μm, can be deposited on the insulating layer, for example, by using a CVD method.

In a seventh exemplary method, the passivation layer 112 can be formed by optionally depositing a first silicon oxynitride layer with a suitable thickness, e.g., of between 0.05 and 0.3 μm using a CVD method. Next, a silicon oxide layer, e.g., with a thickness of between 0.2 and 1.2 μm, can be deposited on the first silicon oxynitride layer using a CVD method. Next, a second silicon oxynitride layer, e.g., with a thickness of between 0.05 and 0.3 μm, can optionally be deposited on the silicon oxide layer using a CVD method. Next, a silicon nitride layer, e.g., with a thickness of between 0.2 and 1.2 μm, can be deposited on the second silicon oxynitride layer or on the silicon oxide using a CVD method. Next, a third silicon oxynitride layer, e.g., with a thickness of between 0.05 and 0.3 μm, can optionally be deposited on the silicon nitride layer using a CVD method. Then, a silicon oxide layer, e.g., with a thickness of between 0.2 and 1.2 μm, can be deposited on the third silicon oxynitride layer or on the silicon nitride layer using a CVD method.

In an eighth exemplary method, the passivation layer 112 can be formed by depositing a first silicon oxide layer, e.g., with a thickness of between 0.2 and 1.2 μm, using a CVD method. Next, a second silicon oxide layer, e.g., with a thickness of between 0.5 and 1 μm, can be deposited on the first silicon oxide layer using a spin-coating method. Following this, a third silicon oxide layer, e.g., with a thickness of between 0.2 and 1.2 μm, can be deposited on the second silicon oxide layer using a CVD method. Next, a silicon nitride layer, e.g., with a thickness of between 0.2 and 1.2 μm, can be deposited on the third silicon oxide layer using a CVD method. Following this, a fourth silicon oxide layer, e.g., with a thickness of between 0.2 and 1.2 μm, can then be deposited on the silicon nitride layer using a CVD method.

In a ninth exemplary method, the passivation layer 112 can be formed by depositing a first silicon oxide layer with a suitable thickness, e.g., between 0.5 and 2 μm using a HDP-CVD method. Next, a silicon nitride layer with a suitable thickness, e.g., between 0.2 and 1.2 μm, can be deposited on the first silicon oxide layer using a CVD method. A second silicon oxide layer, e.g., with a thickness of between 0.5 and 2 μm, can then be deposited on the silicon nitride using a HDP-CVD method.

In a tenth exemplary method, the passivation layer 112 can be formed by depositing a first silicon nitride layer with a suitable thickness, e.g., between 0.2 and 1.2 μm, using a CVD method. Next, a silicon oxide layer, e.g., with a thickness of between 0.2 and 1.2 μm, can be deposited, on the first silicon nitride layer using a CVD method. A second silicon nitride layer with a suitable thickness, e.g., between 0.2 and 1.2 μm, can then be deposited on the silicon oxide layer using a CVD method.

In an eleventh method, the passivation layer 112 can be formed by depositing a single layer of silicon nitride with a suitable thickness, e.g., between 0.2 and 1.5 micrometers, and preferably between 0.3 and 1.2 micrometers, using a CVD method. Alternatively, a single layer of silicon oxynitride with a suitable thickness, e.g., between 0.2 and 1.5 micrometers, and preferably between 0.3 and 1.2 micrometers, can be deposited using a CVD method. Or, a single layer of silicon carbon nitride with a suitable thickness, e.g., between 0.2 and 1.5 micrometers, and preferably between 0.3 and 1.2 micrometers, can be deposited using a CVD method.

In a twelfth method, the passivation layer 112 can be formed by depositing a silicon oxide layer with a suitable thickness, e.g., between 0.2 and 1.2 micrometers, using a CVD method. Next, a silicon carbon nitride layer with a suitable thickness, e.g. between 0.2 and 1.2 micrometers, can be deposited on the silicon oxide layer using a CVD method.

In a thirteenth method, the passivation layer 112 can be formed by depositing a first silicon carbon nitride layer with a suitable thickness, e.g., between 0.2 and 1.2 micrometers, can be deposited using a CVD method. Next, a silicon oxide layer with a suitable thickness, e.g., between 0.2 and 1.2 micrometers, can be deposited on the first silicon carbon nitride layer using a CVD method. Then a second silicon carbon nitride layer with a suitable thickness, e.g., between 0.2 and 1.2 micrometers, can be deposited on the silicon oxide layer using a CVD method.

In a fourteenth method, the passivation layer 112 can be formed by depositing a silicon carbon nitride layer with a suitable thickness, e.g., between 0.2 and 1.2 micrometers, using a CVD method. Next, a silicon oxide layer with a suitable thickness, e.g., between 0.2 and 1.2 micrometers, can be deposited on the silicon carbon nitride layer using a CVD method. Then, a silicon nitride layer with a suitable thickness, e.g., between 0.2 and 1.2 micrometers, can be deposited on the silicon oxide layer using a CVD method.

In a fifteenth method, the passivation layer 112 can be formed by depositing a silicon nitride layer with a suitable thickness, e.g., between 0.2 and 1.2 micrometers, using a CVD method. Next, a silicon oxide layer with a suitable thickness, e.g., between 0.2 and 1.2 micrometers, can be deposited on the silicon nitride layer using a CVD method. Next, a silicon carbon nitride layer with a suitable thickness, e.g., between 0.2 and 1.2 micrometers, can be deposited on the silicon oxide layer using a CVD method.

With continued reference to FIG. 1a, passivation layer 112 can include more than one passivation layer opening 114, to expose part(s) of the metal trace(s) or pad(s) 110 underneath. The passivation layer opening 114 can be in any desired and practical shape, e.g., the shape of a circle, square, rectangle, or polygon with more than five edges; different shapes can have different opening dimensions and characteristics. For example, a circular opening has dimensions defined by its diameter, a square opening has dimensions defined by its side length, and a polygon with more than five edges has dimensions defined by the longest diagonal. The shape of the openings are not limited to regular shapes and irregular and/or composite shapes may be used for the passivation layer openings.

The portions of the metal traces or pads 110 exposed by the passivation layer openings 114 in the passivation layer 112 define contact pads, e.g., contact pad or point 110', as shown. On contact pads 110', there can be an optional metal cap (not shown) to protect a contact pad 110' from being damaged by oxidation. Such metal caps can include, for example, an aluminum-copper alloy, a gold layer, a titanium tungsten alloy layer, a tantalum layer, a tantalum nitride layer, or a nickel layer, though other suitable cap materials can be used. For example, when contact pads 110' are copper pads, a metal cap is preferably included, such as an aluminum-copper alloy, to protect the copper pad exposed by the passivation layer openings 114 from oxidation, which could otherwise damage the copper pad. Also, when the metal cap is an aluminum-copper alloy, a barrier layer can be formed between the copper pad and aluminum-copper alloy. This barrier layer can include a suitable metal such as titanium, titanium tungsten alloy, titanium nitride, tantalum, tantalum nitride, chromium, or nickel; the preceding are particular examples and other suitable metals can be used. The following method is applicable for a situation where there is no metal cap, but a similar method can be used for the addition of a metal cap.

Referring to FIG. 1b, an adhesion/barrier layer 116 having a suitable thickness, e.g., between 1 nanometer and 0.8 micrometers, and preferably between 0.01 and 0.7 micrometers, can be formed on the contact pads 110' exposed by the openings 114, on the passivation layer 112. The adhesion/barrier layer 116 can be formed by sputtering a titanium-containing layer, such as titanium-tungsten-alloy layer, titanium-nitride layer or titanium layer, having a suitable thickness, e.g., between 1 nanometer and 0.8 micrometers, and preferably between 0.01 and 0.7 micrometers, on the contact pads 110' exposed by the openings 114, on the passivation layer 112. Alternatively, the adhesion/barrier layer 116 can be formed by sputtering a chromium-containing layer, such as chromium layer, having a thickness between, e.g., 1 nanometer and 0.8 micrometers, and preferably between 0.01 and 0.7 micrometers, on the contact pads 110' exposed by the openings 114, on the passivation layer 112. Alternatively, the adhesion/barrier layer 116 can be formed by sputtering a tantalum-containing layer, such as tantalum layer or tantalum-nitride layer, having a suitable thickness, e.g., between 1 nanometer and 0.8 micrometers, and preferably between 0.01 and 0.7 micrometers, on the contact pads 110' exposed by the openings 114, on the passivation layer 112. Alternatively, the adhesion/barrier layer 116 can be formed by sputtering a nickel layer having a thickness between 1 nanometer and 0.8 micrometers, and preferably between 0.01 and 0.7 micrometers, on the regions of the contact pads 110' exposed by the openings 114, on the passivation layer 112.

After forming the adhesion/barrier layer 116, a seed layer 118 can be formed on the adhesion/barrier layer 116. The seed layer can have a desired thickness, e.g., between 0.01 and 2 micrometers, and preferably between 0.02 and 0.5 micrometers. The seed layer 118, for example, can be formed by sputtering a copper layer having a suitable thickness, for example, between 0.01 and 2 micrometers, and preferably between 0.02 and 0.5 micrometers, on the adhesion/barrier layer 116 of any previously-described material. Alternatively, the seed layer 118 can be formed by sputtering a gold layer having a suitable thickness, e.g., between 0.01 and 2 micrometers, and preferably between 0.02 and 0.5 micrometers, on the adhesion/barrier layer 116 of any previously-described material. Alternatively, the seed layer 118 can be formed by sputtering a silver layer having a suitable thickness, for example, between 0.01 and 2 micrometers, and preferably between 0.02 and 0.5 micrometers, on the adhesion/barrier layer 116 of any previously-described material. Alternatively, the seed layer 118 can be formed by sputtering an aluminum-containing layer, such as aluminum layer, aluminum-copper alloy layer or Al—Si—Cu alloy layer, having a suitable thickness, e.g., between 0.01 and 2 micrometers or between 0.4 and 3 micrometers on the adhesion/barrier layer 116 of any previously-described material.

Referring to FIG. 1c, after forming the seed layer 118, a patterned photoresist layer 120 can be formed on the seed layer 118 of any previously-described material. Multiple openings 120a can be formed in the patterned photoresist layer 120 to expose multiple regions 118a of the seed layer 118 of any previously-described material. Next, referring to FIG. 1d, a metal layer 122 can be formed on the regions 118a of the seed layer 118 of any previously-described material. The metal layer 122 may have a suitable thickness, T1, for example, between 1 and 15 micrometers, between 5 and 50 micrometers, between 3 and 100 micrometers, between 20 and 150 micrometers or between 50 and 250 micrometers, and greater than that of the seed layer 118, that of the adhesion/barrier layer 116, that of each of the contact pads 110', and that of each of the metal layers 106, respectively.

For example, metal layer 122 can be formed as or composed of a single metal layer formed by electroplating a gold layer having a suitable thickness, for example, between 1 and 15 micrometers, between 5 and 50 micrometers or between 3 and 100 micrometers on the regions 118a of the seed layer 118. The seed layer 118 can be, in exemplary embodiments, the previously-described gold layer. A suitable electroplating solution can be used, e.g., one containing gold of between 1 and 20 grams per litter (g/l), and preferably between 5 and 15 g/l, and sulfite ion of 10 and 120 g/l, and preferably between 30 and 90 g/l. The electroplating solution may further include sodium ion, to be turned into a solution of gold sodium sulfite ($Na_3Au(SO_3)_2$), or may further include ammonium ion, to be turned into a solution of gold ammonium sulfite (($NH_4)_3[Au(SO_3)_2]$).

Alternatively, metal layer 122 can be formed as or composed of a single metal layer formed by electroplating a copper layer having a desired thickness, e.g., between 1 and 15 micrometers, between 5 and 50 micrometers or between 3 and 100 micrometers on the regions 118a of the seed layer 118, preferably the previously-described copper layer for the seed layer 118. For this, an electroplating solution containing $CuSO_4$, $Cu(CN)_2$ or $CuHPO_4$ can be used.

Alternatively, metal layer 122 can be formed as or composed of a single metal layer formed by electroplating a silver layer having a suitable thickness, e.g., between 1 and 15 micrometers, between 5 and 50 micrometers or between 3 and 100 micrometers on the regions 118a of the seed layer 118, preferably the previously-described silver layer for the seed layer 118.

Alternatively, metal layer 122 can be formed as or composed of two (double) metal layers formed by electroplating a copper layer having a suitable thickness, e.g., between 1 and 15 micrometers, between 5 and 50 micrometers or between 3 and 100 micrometers on the regions 118a of the seed layer 118, preferably the previously-described copper layer for the seed layer 118, using the previously-described electroplating solution for electroplating copper. Then a gold layer having a suitable thickness, for example, between 0.1 and 10 micrometers, and preferably between 0.5 and 5 micrometers, can be electroplated or electroless (e.g., immersion) plated on the electroplated copper layer in the openings 120a.

Alternatively, metal layer 122 can be formed as or composed of three (triple) metal layers formed by electroplating a copper layer having a suitable thickness, e.g., between 1 and 15 micrometers, between 5 and 50 micrometers or between 3 and 100 micrometers, on the regions 118a of the seed layer 118. In exemplary embodiments, the seed layer 118 can be the previously-described copper layer, The previously-described electroplating solution can be used for electroplating copper. Next, a nickel layer having a desired thickness, e.g., between 0.5 and 8 micrometers, and preferably between 1 and 5 micrometers, can be formed on the electroplated copper layer in the openings 120a by electroplating of electroless plating. Then a gold layer having a suitable thickness, e.g., between 0.1 and 10 micrometers, and preferably between 0.5 and 5 micrometers, can be electroplated or electroless plated on the electroplated or electroless plated nickel layer in the openings 120a.

Alternatively, metal layer 122 can be formed as or composed of three (triple) metal layers formed by electroplating a copper layer having a suitable thickness, e.g., between 1 and 15 micrometers, between 5 and 50 micrometers or between 3 and 100 micrometers, on the regions 118a of the seed layer 118. The previously-described copper layer can be used for the seed layer 118. The previously-described electroplating solution can be used for electroplating copper. Next, a nickel layer having a desired thickness, for example, between 0.5 and 8 micrometers, and preferably between 1 and 5 micrometers, can be electroplated or electroless plated on the electroplated copper layer in the openings 120a. Then a platinum layer having a suitable thickness, e.g., between 0.1 and 10 micrometers, and preferably between 0.5 and 5 micrometers, can be electroplated or electroless plated on the electroplated or electroless plated nickel layer in the openings 120a.

Alternatively, metal layer 122 can be formed by electroplating a copper layer having a suitable thickness, for example, between 1 and 15 micrometers, between 5 and 50 micrometers, between 3 and 100 micrometers, between 20 and 250 micrometers or between 30 and 350 micrometers, on the regions 118a of the seed layer 118. The seed layer 118 can be the previously-described copper layer. Then a nickel layer having a suitable thickness, e.g., between 0.5 and 8 micrometers, and preferably between 1 and 5 micrometers, can be electroplated or electroless plated on the electroplated copper layer in the openings 120a. Next a platinum layer having a suitable thickness, e.g., between 0.1 and 10 micrometers, and preferably between 0.5 and 5 micrometers, can be electroplated or electroless plated on the electroplated or electroless plated nickel layer in the openings 120a. Then a gold layer having a suitable thickness, for example, between 0.1 and 10 micrometers, and preferably between 0.5 and 5 micrometers, can be formed (e.g., by electroplating or electroless plating) on the electroplated or electroless plated platinum layer in the openings 120a.

Next, referring to FIG. 1e, the patterned photoresist layer 120 can be removed. Referring to FIG. 1f, after removing the photoresist layer 120, the seed layer 118 not under the metal layer 122 can be removed by using a wet-etching process or a dry-etching process. After removing the seed layer 118 not under the metal layer 122, the adhesion/barrier layer 116 not under the metal layer 122, can be removed by using a wet-etching process or a dry-etching process.

As shown in FIG. 1f, after etching the seed layer 118 and the adhesion/barrier layer 116 not under the metal layer 122, an undercut 123 may be formed under the seed layer 118 and under the metal layer 122 when the adhesion/barrier layer 116 not under the metal layer 122 is removed using a wet etching method. The adhesion/barrier layer 116 under the metal layer 122 can have a first sidewall recessed from a second sidewall of the seed layer 118. A distance, d1, between the first sidewall and the second sidewall can be between 0.3 and 2 micrometers, in exemplary embodiments, though this distance d1 can be varied for different applications.

After removing the adhesion/barrier layer 116 not under the metal layer 122, the metal pads, bumps, pillars, or posts 124 can be formed on the regions of the contact pads 110' exposed by the openings 112a and on the passivation layer 112. The metal pads or bumps or metal pillars or posts 124 can include an adhesion/barrier layer 116 of any previously-described material on the regions of the contact pads 110' exposed by the openings 112a and on the passivation layer 112, the seed layer 118 of any previously-described material on the adhesion/barrier layer 116, and the metal layer 122 of any previously-described material on the seed layer 118. Sidewalls of the metal layer 122 are not necessarily covered by the adhesion/barrier layer 116 and the seed layer 118. The metal pads or bumps or metal posts (or metal pillars) 124 may have a suitable thickness or height, e.g., between 1 and 15 micrometers, between 5 and 50 micrometers or between 3 and 100 micrometers or between 30 and 150 micrometers, and a suitable width, for example, between 5 and 100 micrometers, and preferably between 5 and 50 micrometers. From a top perspective view, each of the metal pads or bumps or metal post 124 can, in exemplary embodiments, be circular in shape with a suitable diameter, e.g., between 5 and 100 micrometers, and preferably between 5 and 50 micrometers, or square-shaped with a desired width, e.g., between 5 and 100 micrometers, and preferably between 5 and 50 micrometers, or rectangular in shape with a shorter width, for example, between 5 and 100 micrometers, and preferably between 5 and 50 micrometers.

The pitch p between the neighboring metal pads, bumps, pillars, or posts 124 can be between 10 and 250 micrometers, preferably between 25 and 35 micrometers, preferably between 25 and 50 micrometers, and preferably between 25 and 100 micrometers.

Next, referring to FIG. 1g, a patterned adhesive polymer 126 having a thickness between 10 and 400 micrometers, and preferably between 20 and 100 micrometers, can be formed on a top surface of the passivation layer 112 and cover a top surface of the metal pads or bumps or metal post 124 by using a screen printing process, using a process including a laminating and a photolithography process, or using a spin-coating process and a photolithography process. In exemplary embodiments, the material of the patterned adhesive polymer 126 can be epoxy, polyimide, SU-8 or acrylic, though other suitable materials may be used.

After formation, the patterned adhesive polymer 126 can then be cured. The curing procedure may be performed by a suitable method/apparatus, e.g., a baking method, a microwave heating method, or an infrared heating method with temperature of between, e.g., 140 and 220 degrees centigrade, between 200 and 320 degrees centigrade or between 320 and 400 degrees centigrade.

After the patterned adhesive polymer 126 has been cured, referring to FIG. 1h, a suitable process, e.g., chemical mechanical polishing (CMP) procedure, mechanical grinding, laser drilling, can be used for the patterned adhesive polymer 126 to reveal the top ends of the metal pads or bumps or metal post 124. The top ends of the metal pads or bumps or metal post 124 are defined as contact pads 128 for the next process.

A dry etch process may be used as an alternative to polishing or grinding the patterned adhesive polymer 126 to reveal or exposed the top ends of the metal pads or bumps or metal post 124. Referring to FIG. 1i, an opening 126a can be formed in the patterned adhesive polymer 126 to expose the top ends of the metal pads or bumps or metal post 124. The top ends of the metal pads or bumps or metal post 124 are defined as contact pads 128 for the next process.

Next, referring to FIG. 1j, an adhesion/barrier layer 130 having a suitable thickness, e.g., between 1 nanometer and 0.8 micrometers, and preferably between 0.01 and 0.7 micrometers, can be formed on the contact pads 128 and on a top surface of the polymer 126. The adhesion/barrier layer 130 can be formed by sputtering a titanium-containing layer, such as titanium-tungsten-alloy layer, titanium-nitride layer or titanium layer, having a suitable thickness between 1 nanometer and 0.8 micrometers, and preferably between 0.01 and 0.7 micrometers, on the contact pads 128 and on the top surface of the polymer 126. Alternatively, the adhesion/barrier layer 130 can be formed by sputtering a chromium-containing layer, such as chromium layer, having a suitable thickness, e.g., between 1 nanometer and 0.8 micrometers, and preferably between 0.01 and 0.7 micrometers, on the contact pads 128 and on the top surface of the polymer 126. Alternatively, the adhesion/barrier layer 130 can be formed by sputtering a tantalum-containing layer, such as tantalum layer or tantalum-nitride layer, having a suitable thickness between 1 nanometer and 0.8 micrometers, and preferably between 0.01 and 0.7 micrometers, on the contact pads 128 and on the top surface of the polymer 126. Alternatively, the adhesion/barrier layer 130 can be formed by sputtering a nickel layer having a suitable thickness, e.g., between 1 nanometer and 0.8 micrometers, and preferably between 0.01 and 0.7 micrometers, on the regions of the contact pads 128 and on the top surface of the polymer 126.

After forming the adhesion/barrier layer 130, a seed layer 132 having a suitable thickness, e.g., between 0.01 and 2 micrometers, and preferably between 0.02 and 0.5 micrometers, can be formed on the adhesion/barrier layer 130 by a suitable process. For example, the seed layer 132, for example, can be formed by sputtering a copper layer having a thickness, e.g., between 0.01 and 2 micrometers, and preferably between 0.02 and 0.5 micrometers, on the adhesion/barrier layer 130 of any previously-described material. Alternatively, the seed layer 132 can be formed by sputtering a gold layer having a suitable thickness, e.g., between 0.01 and 2 micrometers, and preferably between 0.02 and 0.5 micrometers, on the adhesion/barrier layer 130 of any previously-described material. Alternatively, the seed layer 132 can be formed by sputtering a silver layer having a suitable thickness, e.g., between 0.01 and 2 micrometers, and preferably between 0.02 and 0.5 micrometers, on the adhesion/barrier layer 130 of any previously-described material. Alternatively, the seed layer 132 can be formed by sputtering an aluminum-containing layer, such as aluminum layer, aluminum-copper alloy layer or Al—Si—Cu alloy layer, having a suitable thickness, e.g., between 0.01 and 2 micrometers or between 0.4 and 3 micrometers on the adhesion/barrier layer 130 of any previously-described material.

Referring to FIG. 1k, after forming the seed layer 132, a patterned photoresist layer 134 can be formed on the seed layer 132, which can be any suitable material, and multiple openings 134a in the patterned photoresist layer 134 can expose multiple regions 132a of the seed layer 132. Next, referring to FIG. 1L, a metal layer 136 can be formed on the regions 132a of the seed layer 132. The metal layer 136 may have a suitable thickness, T2, for example, between 1 and 15 micrometers, between 5 and 50 micrometers, between 3 and 100 micrometers, between 20 and 150 micrometers, between 30 and 250 micrometers or between 40 and 320 micrometers, and greater than that of the seed layer 132, that of the adhesion/barrier layer 130, respectively.

For example, the metal layer 136 can be a single metal layer formed by electroplating a gold layer having a suitable thickness, e.g., between 1 and 15 micrometers, between 5 and 50 micrometers or between 3 and 100 micrometers on the regions 132a of the seed layer 132. In exemplary embodiments, the previously-described gold layer can be used for the seed layer 132. For the gold electroplating, a suitable electroplating solution can be used, for example, one containing gold between 1 and 20 grams per litter (g/l), and preferably between 5 and 15 g/l, and sulfite ion of 10 and 120 g/l, and preferably between 30 and 90 g/l. The electroplating solution may, in exemplary embodiments, further include sodium ion, to be turned into a solution of gold sodium sulfite ($Na_3Au(SO_3)_2$), or may further include ammonium ion, to be turned into a solution of gold ammonium sulfite ($(NH_4)_3[Au(SO_3)_2]$).

Alternatively, the metal layer 136 can be a single metal layer formed by electroplating a copper layer having a suitable thickness, e.g., between 1 and 15 micrometers, between 5 and 50 micrometers or between 3 and 100 micrometers on the regions 132a of the seed layer 132, preferably the previously-described copper layer for the seed layer 132, with an electroplating solution containing $CuSO_4$, $Cu(CN)_2$ or $CuHPO_4$.

Alternatively, the metal layer 136 can be a single metal layer formed by electroplating a silver layer having a suitable thickness, e.g., between 1 and 15 micrometers, between 5 and 50 micrometers or between 3 and 100 micrometers on the regions 132a of the seed layer 132, preferably the previously-described silver layer for the seed layer 132.

Alternatively, the metal layer 136 can be formed as or composed of two (double) metal layers formed by electroplating a copper layer having a suitable thickness, for example, between 1 and 15 micrometers, between 5 and 50 micrometers or between 3 and 100 micrometers on the regions 132a of the seed layer 132. In exemplary embodiments, the previously-described copper layer can be utilized for the seed layer 132. For copper electroplating, the previously-described electroplating solution can be used. Then a gold layer having a suitable thickness, e.g., between 0.1 and 10 micrometers, and preferably between 0.5 and 5 micrometers, can be electroplated or electroless plated on the electroplated copper layer in the openings 134a.

Alternatively, the metal layer 136 can be formed as or composed of three (triple) metal layers formed by electroplating a copper layer having a suitable thickness, e.g., between 1 and 15 micrometers, between 5 and 50 micrometers or between 3 and 100 micrometers on the regions 132a of the seed layer 132. In exemplary embodiments, the previously-described copper layer can be used for the seed layer 132. For copper electroplating, the previously-described electroplating solution can be used. Next, a nickel layer having a suitable thickness, e.g., between 0.5 and 8 micrometers, and preferably between 1 and 5 micrometers, can be electroplated or electroless plated on the electroplated copper layer in the openings 134a. Then, a gold layer having a suitable thickness, e.g., between 0.1 and 10 micrometers, and preferably between 0.5 and 5 micrometers, can be electroplated or electroless plated on the electroplated or electroless plated nickel layer in the openings 134a.

Alternatively, the metal layer 136 can be formed as or composed of three (triple) metal layers formed by electroplating a copper layer having a suitable thickness, for example, between 1 and 15 micrometers, between 5 and 50 micrometers or between 3 and 100 micrometers on the regions 132a of the seed layer 132. In exemplary embodiments, the previously-described copper layer can be used for the seed layer 132. The previously-described electroplating solution can be used for electroplating copper. Next, a nickel layer having a suitable thickness, for example, between 0.5 and 8 micrometers, and preferably between 1 and 5 micrometers, can be electroplated or electroless plated on the electroplated copper layer in the openings 134a. Then, a platinum layer having a suitable thickness, for example, between 0.1 and 10 micrometers, and preferably between 0.5 and 5 micrometers, can be electroplated or electroless plated on the electroplated or electroless plated nickel layer in the openings 134a.

Alternatively, the metal layer 136 can be formed by electroplating a copper layer having a suitable thickness, e.g., between 1 and 15 micrometers, between 5 and 50 micrometers or between 3 and 100 micrometers on the regions 132a of the seed layer 132. In exemplary embodiments, the previously-described copper layer can be used for the seed layer 132. A nickel layer having a suitable thickness, e.g., between 0.5 and 8 micrometers, and preferably between 1 and 5 micrometers, can be electroplated or electroless plated on the electroplated copper layer in the openings 134a. Next, a platinum layer having a suitable thickness, e.g., between 0.1 and 10 micrometers, and preferably between 0.5 and 5 micrometers, can be electroplated or electroless plated on the electroplated or electroless plated nickel layer in the openings 134a. Then, a gold layer having a suitable thickness, e.g., between 0.1 and 10 micrometers, and preferably between 0.5 and 5 micrometers, can be electroplated or electroless plated on the electroplated or electroless plated platinum layer in the openings 134a.

Alternatively, the metal layer 136 can be formed by electroplating a copper layer having a suitable thickness, e.g., between 1 and 15 micrometers, between 5 and 50 micrometers or between 3 and 100 micrometers, on the regions 132a of the seed layer 132. In exemplary embodiments, the previously-described copper layer can be used for the seed layer 132. A nickel layer having a suitable thickness, for example, between 0.5 and 8 micrometers, and preferably between 1 and 5 micrometers, can be electroplated or electroless plated on the electroplated copper layer in the openings 134a. A solder layer having a suitable thickness, e.g., between 0.1 and 150 micrometers, or between 5 and 100 micrometers, and preferably between 15 and 50 micrometers, can be formed on the electroplated or electroless plated nickel layer in the openings 134a. The solder can be formed by screen plating, ball mounting, or an electroplating process, such as gold-tin alloy, tin-silver alloy, tin-silver-copper alloy, indium, tin-bismuth alloy, or other lead-free alloy; lead alloy solders can also be used but are less desirable due to toxicity considerations.

Next, referring to FIG. 1m, the patterned photoresist layer 134 can be removed. Referring to FIG. 1n, after removing the photoresist layer 134, the seed layer 132 not under the metal layer 136 can be removed by using a wet-etching process or a dry-etching process. After removing the seed layer 132 not under the metal layer 136, the adhesion/barrier layer 130 not under the metal layer 136, can be removed by using a wet-etching process or a dry-etching process.

As shown in FIG. 1n, after etching the seed layer 132 and the adhesion/barrier layer 130 not under the metal layer 136, an undercut 137 may be formed under the seed layer 132 and under the metal layer 136 when the adhesion/barrier layer 130 not under the metal layer 136 is removed using a wet etching method. The adhesion/barrier layer 130 under the metal layer 136 can have a first sidewall recessed from a second sidewall of the seed layer 132, and a distance, d2, between the first sidewall and the second sidewall. In exemplary embodiments, d2, can be between 0.3 and 2 micrometers, though other values may be used for d2.

After etching the seed layer 132 and the adhesion/barrier layer 130 not under the metal layer 136, the other polymer layer (not shown) can be formed on the metal layer 136 for protection.

The semiconductor wafer 100 can be cut into a plurality of individual semiconductor chips by a die-sawing process.

Referring to FIG. 1o and FIG. 1p, when the metal layer 136 includes an electroplating or electroless plating gold layer, copper layer or platinum layer, the metal layer 136 can be utilized as a pad for wire-bonding (i.e., used as a wirebonded pad). The metal layer 136 can connect to an external circuit through a bonded wire 138, such as gold wires or copper wires or the like.

Embodiment 2

Figure 1Q:
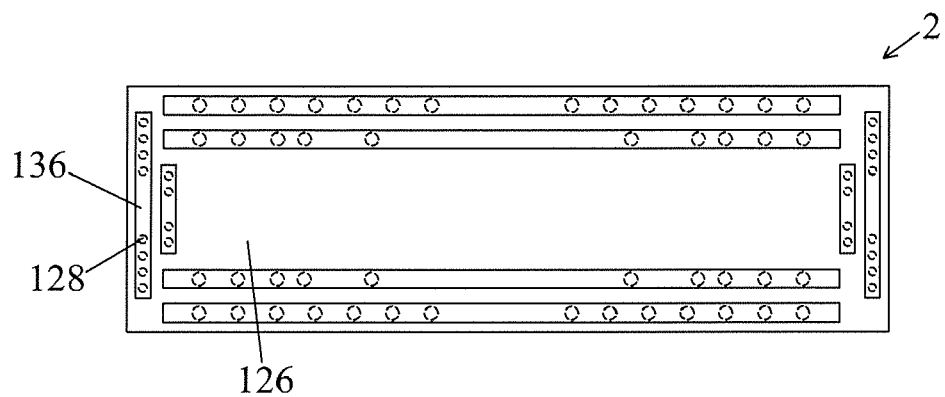

FIG. 1q illustrates a top view of a second exemplary embodiment 2, in accordance with the present disclosure. After the steps illustrated in FIG. 1n, the semiconductor wafer 100 can be cut into a plurality of individual semiconductor chips by a die-sawing process. As shown, the metal layer 136 can be rectangular in shape. Some metal layers 136 are connected to more than two contact pads 128. The patterned adhesive polymer 126 is also shown.

For applications where the metal layer 136 includes an electroplating or electroless plating gold layer, the metal layer 136 can be connected to a flexible substrate by a chip-on-film (COF) process. Or the metal layer 136 may be connected to a glass substrate by a chip-on-film (COG) process.

For applications where the metal layer 136 includes an electroplating copper layer, the metal layer 136 can be connected to a solder metal contact pad of Ball Grid Array (BGA) substrate by a flip chip process.

Embodiment 3

Figure 1R:
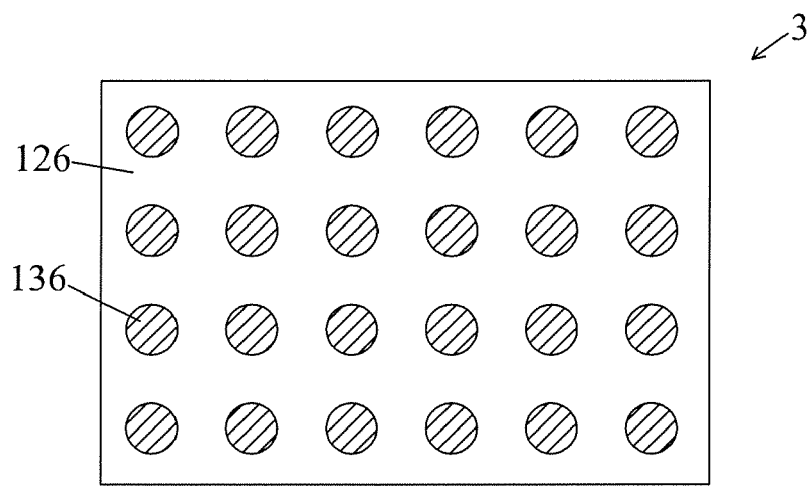

FIG. 1r illustrates a top view of a third exemplary embodiment 3, in accordance with the present disclosure. After the steps illustrated in FIG. 1n, the semiconductor wafer 100 can be cut into a plurality of individual semiconductor chips by a die-sawing process. As shown, the metal layer 136 can be circular in shape. The metal layers 136 can have similar diameters and a regular pitch in two dimensions, as shown. The patterned adhesive polymer 126 is also shown.

When the metal layer 136 is configured as a metal bump and includes an electroplating copper layer, the metal layer 136 can be connected to a solder ball formed on a contact pad of Ball Grid Array (BGA) substrate by a flip chip process.

Figure 1S:
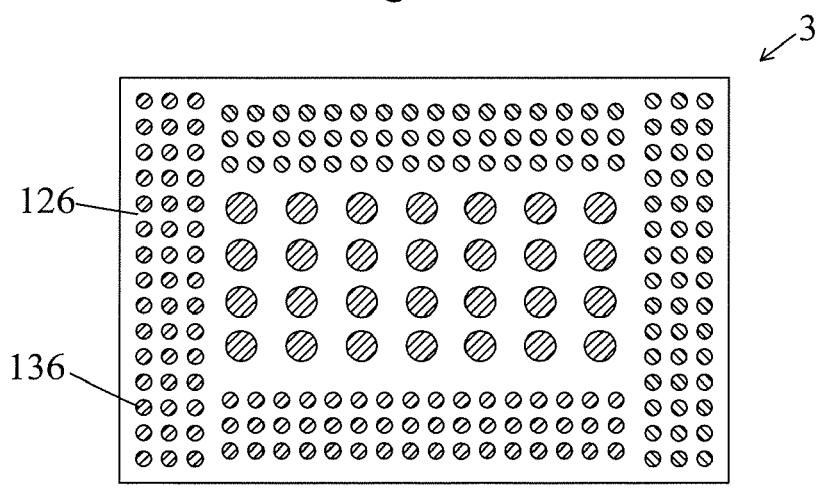

FIG. 1s illustrates another top view of embodiment 3. The metal layers 136 can be spherical in shape, as shown. The metal layers 136 may be separated into two groups, a perimeter group and an inside group. The perimeter group and inside group have different diameters and pitches.

Embodiment 4

Figure 1T:
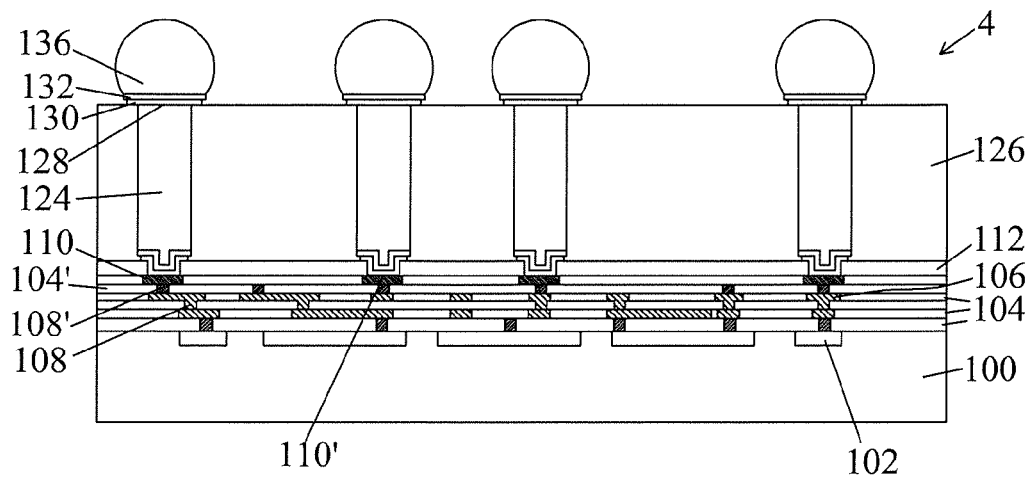
Figure 1U:
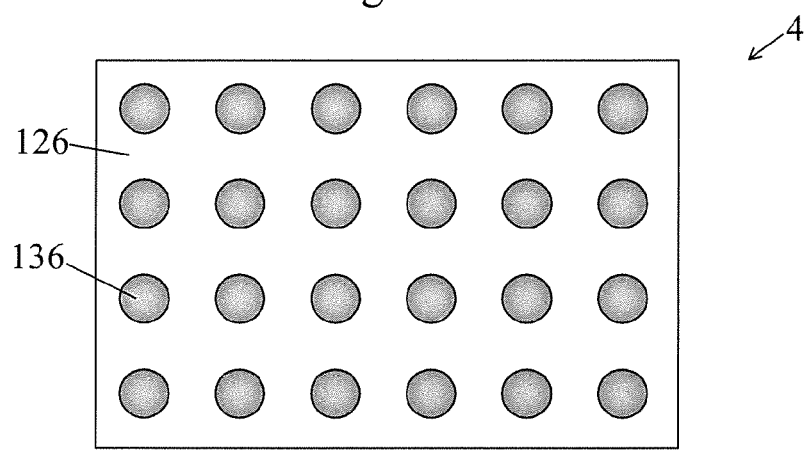
Figure 1V:
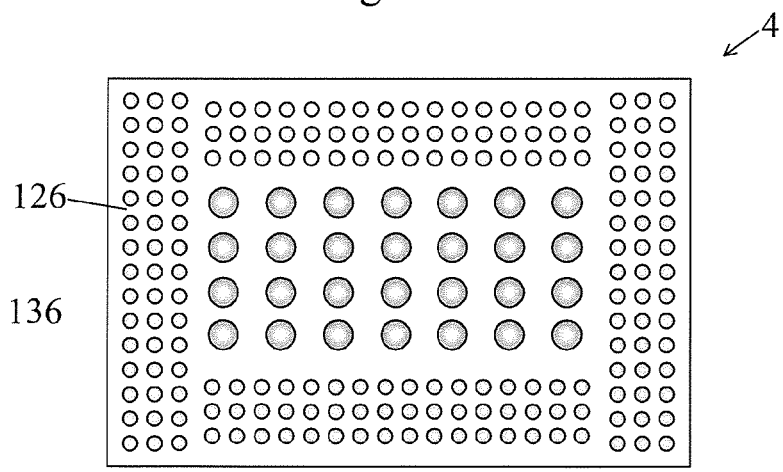

FIG. 1t-1v illustrate a fourth exemplary embodiment 4, in accordance with the present disclosure. FIG. 1t illustrates the metal layers 136, after the steps illustrated in FIG. 1n, as a metal bump including an electroplating solder layer, such as gold-tin alloy, tin-silver alloy, tin-silver-copper alloy, indium, tin-bismuth alloy or other lead-free alloy. The metal layer 136 can be configured in a hemispherical shape, e.g., through the process of reflow in an environment containing oxygen less than 20 ppm. The patterned adhesive polymer 126 is also shown.

The semiconductor wafer 100 can be cut into a plurality of individual semiconductor chips by a die-sawing process. The metal layer 136 can be connected to a Ball Grid Array (BGA) substrate by a flip chip process.

FIG. 1u illustrates a top view of the embodiment 4. The metal layers 136 can be configured in a ball shape or hemispherical, as shown. The metal layers 136 can have the similar diameters and regular pitch between them.

FIG. 1v illustrates another top view of the embodiment 4. The metal layers 136 can be hemispherical in shape, as shown. The metal layers 136 may be separated into two groups, a perimeter group and an inside group. The perimeter group and inside group have different diameters and pitches.

Embodiment 5

Figure 1W:
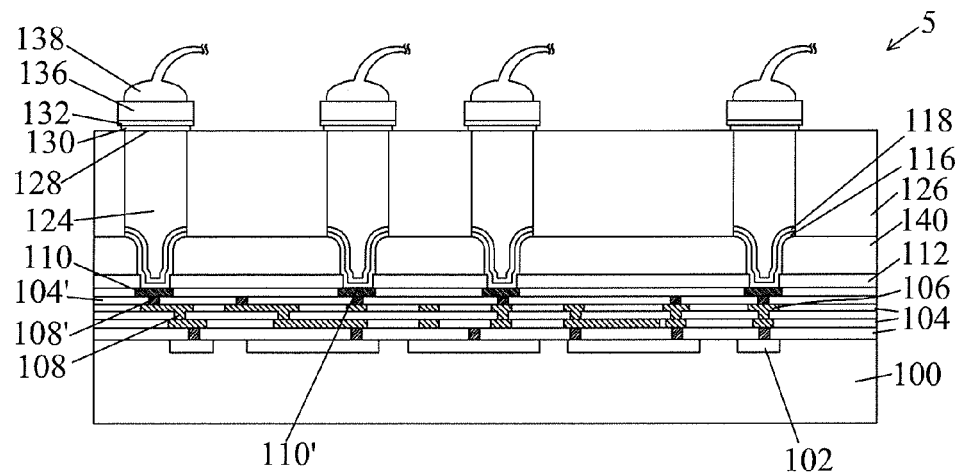

FIG. 1w is a cross-sectional view of a fifth embodiment 5, in accordance with the present disclosure. The embodiment 5 is similar to the embodiment 1. FIG. 1w illustrates a final structure of the embodiment 5. The different process is forming a patterned polymer layer 140 on the passivation layer 112 before the adhesion/barrier layer 116 formed on the contact pads 110' exposed by the openings 114, on the passivation layer 112. Multiple openings 140a in the patterned polymer layer 140 can expose the contact pads 110' and passivation layer 112. The detailed process of the embodiment 5 is similar to the embodiment 1, particularly as shown in FIGS. 1b-1p.

Embodiment 6

Figure 1X:
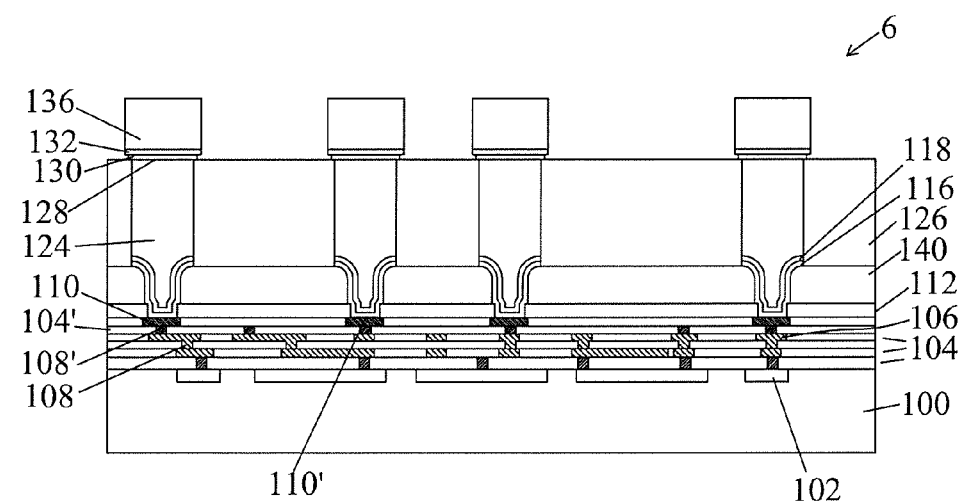

FIG. 1x is a cross-sectional view of a sixth embodiment 6, in accordance with the present disclosure. The embodiment 6 is similar to embodiments 2 and 3. Referring to FIG. 1x, the different process is forming a patterned polymer layer 140 on the passivation layer 112 before the adhesion/barrier layer 116 formed on the contact pads 110' exposed by the openings 114, on the passivation layer 112. Multiple openings 140a in the patterned polymer layer 140 can expose the contact pads 110' and passivation layer 112. The detailed process of the embodiment 6 is similar to embodiments 1-3, particularly as shown in FIGS. 1b-1n and FIGS. 1q-1s.

After the steps illustrated in FIG. 1n, the semiconductor wafer 100 can be cut into a plurality of individual semiconductor chips by a die-sawing process.

For applications in which the metal layers 136 include an electroplating or electroless plating gold layer, the metal layers 136 can be connected to a flexible substrate by a chip-on-film (COF) process. Or the metal layers 136 may be connected to a glass substrate by a chip-on-film (COG) process.

For applications in which the metal layers 136 include an electroplating copper layer, the metal layer 136 can be connected to a solder metal contact pad of Ball Grid Array (BGA) substrate by a flip chip process, for exemplary embodiments.

Embodiment 7

Figure 1Y:
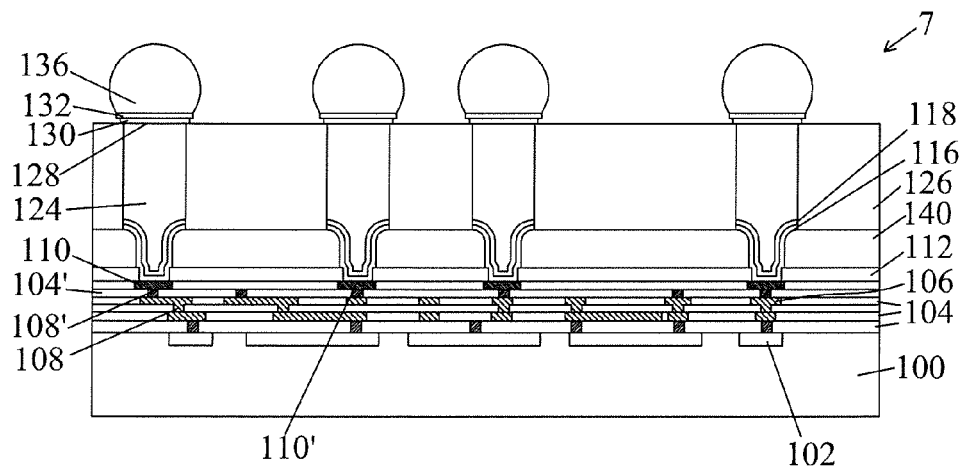

FIG. 1y is a cross-sectional view of a seventh embodiment, in accordance with the present disclosure. The embodiment 7 is similar to the embodiment 4. Referring to FIG. 1y, the different process is forming a patterned polymer layer 140 on the passivation layer 112 before the adhesion/barrier layer 116 formed on the contact pads 110' exposed by the openings 114, on the passivation layer 112. Multiple openings 140a in the patterned polymer layer 140 can expose the contact pads 110' and passivation layer 112. The detailed process of the embodiment 7 is similar to the embodiment 4, and steps shown in FIGS. 1b-1n, FIG. 1u and FIG. 1v.

In exemplary embodiments, the metal layer includes an electroplating solder layer, such as, for example, gold-tin alloy, tin-silver alloy, tin-silver-copper alloy, indium, tin-bismuth alloy or other lead-free alloy. The metal layer 136 can be formed into a hemisphere shape, e.g., through the process of reflow in an environment containing oxygen less than 20 ppm.

The semiconductor wafer 100 can be cut into a plurality of individual semiconductor chips by a die-sawing process. The metal layer 136 can be connected to a Ball Grid Array (BGA) substrate by a flip chip process.

Embodiment 8

Figure 2A:
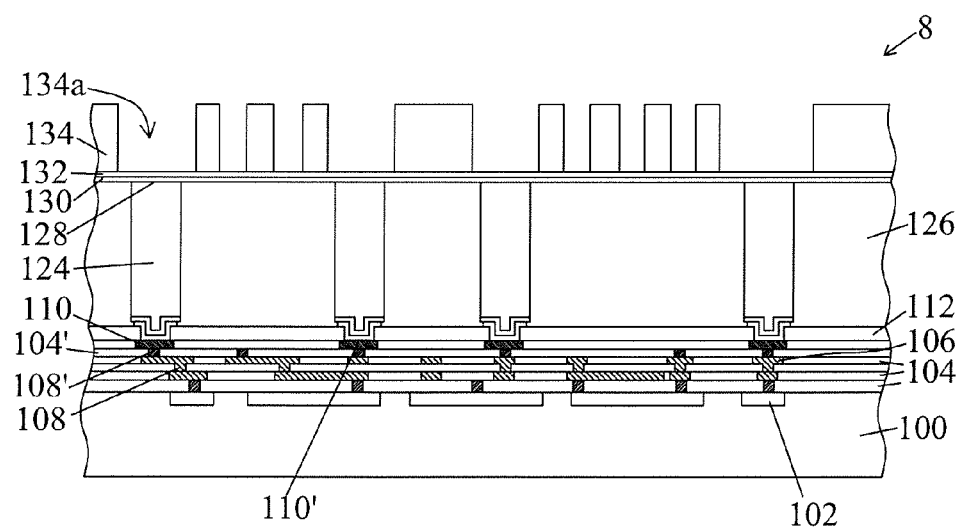
FIG. 2a-2f are cross-sectional views showing an eighth embodiment including a process of forming a chip, in accordance with the present disclosure.

FIG. 2a-2f are cross-sectional views showing an eighth exemplary embodiment 8 including a process of forming a chip, in accordance with the present disclosure. Embodiment 8 can be utilized for forming an inductor on the contact pads 128 and on a top surface of the polymer 126. After the steps illustrated in FIG. 1j, as shown in FIG. 2a, a patterned photoresist layer 134 can be formed on the seed layer 132 of any previously-described material, and multiple openings 134a in the patterned photoresist layer 134 can expose multiple regions 132a of the seed layer 132 of any previously-described material. The shape of the openings 134a can include a coil, multiple coils, a square coil or multiple square coils, or other shapes.

Figure 2B:
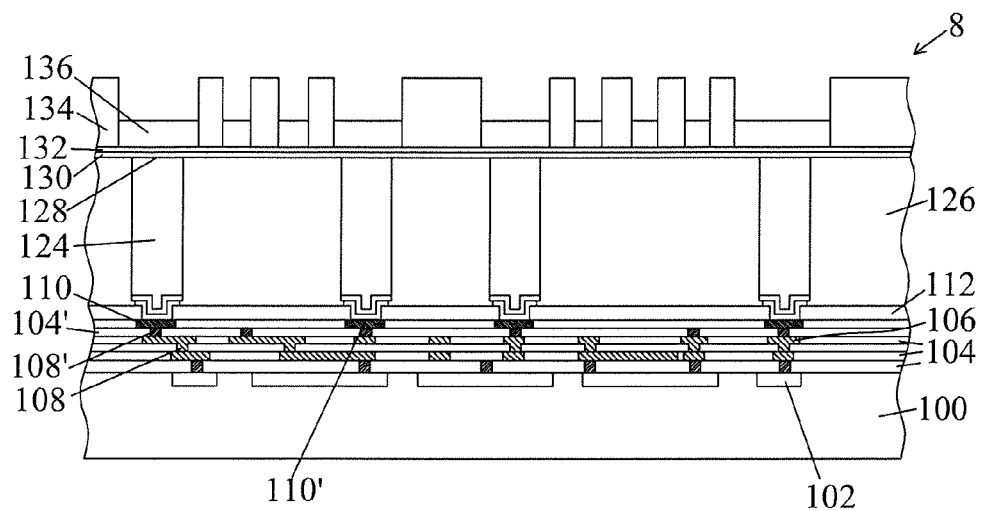

Next, referring to FIG. 2b, a metal layer 136 can be formed on the regions 132a of the seed layer 132 of any previously-described material. The metal layer 136 may have a suitable thickness, e.g., between 1 and 15 micrometers, between 5 and 50 micrometers, between 3 and 100 micrometers, between 20 and 150 micrometers, between 30 and 250 micrometers or between 40 and 320 micrometers, and greater than that of the seed layer 132, that of the adhesion/barrier layer 130, respectively.

For example, the metal layer 136 can be a single metal layer formed by electroplating a gold layer having a suitable thickness, e.g., between 1 and 15 micrometers, between 5 and 50 micrometers or between 3 and 100 micrometers on the regions 132a of the seed layer 132. In exemplary embodiments, the previously-described gold layer can be used for the seed layer 132. A suitable electroplating solution containing gold can be used, e.g., a solution containing gold between 1 and 20 grams per litter (g/l), and preferably between 5 and 15 g/l, and sulfite ion of 10 and 120 g/l, and preferably between 30 and 90 g/l. The electroplating solution may further include sodium ion, to be turned into a solution of gold sodium sulfite ($Na_3Au(SO_3)_2$), or may further include ammonium ion, to be turned into a solution of gold ammonium sulfite (($NH_4)_3[Au(SO_3)_2]$).

Alternatively, the metal layer 136 can be a single metal layer, e.g., formed by electroplating a copper layer having a suitable thickness, e.g., between 1 and 15 micrometers, between 5 and 50 micrometers or between 3 and 100 micrometers, on the regions 132a of the seed layer 132, preferably the previously-described copper layer for the seed layer 132, with an electroplating solution containing $CuSO_4$, $Cu(CN)_2$ or $CuHPO_4$.

Alternatively, the metal layer 136 can be a single metal layer formed by electroplating a silver layer having a suitable thickness, e.g., between 1 and 15 micrometers, between 5 and 50 micrometers or between 3 and 100 micrometers on the regions 132a of the seed layer 132, preferably the previously-described silver layer for the seed layer 132.

Alternatively, the metal layer 136 can be composed of two (forming double) metal layers formed by electroplating a copper layer having a suitable thickness, e.g., between 1 and 15 micrometers, between 5 and 50 micrometers or between 3 and 100 micrometers, on the regions 132a of the seed layer 132. The previously-described copper layer is preferably used for the seed layer 132. The previously-described electroplating solution is preferably used for electroplating copper. Then a gold layer having a suitable thickness, for example, between 0.1 and 10 micrometers, and preferably between 0.5 and 5 micrometers, can be electroplated or electroless plated on the electroplated copper layer in the openings 134a.

Alternatively, the metal layer 136 can be composed of three (forming triple) metal layers formed by electroplating a copper layer having a suitable thickness, e.g., between 1 and 15 micrometers, between 5 and 50 micrometers or between 3 and 100 micrometers on the regions 132a of the seed layer 132. In exemplary embodiments, the previously-described copper layer can be utilized for the seed layer 132. The previously-described electroplating solution can be used for electroplating copper. Then a nickel layer can be electroplated or electroless plated on the electroplated copper layer in the openings 134a. The nickel layer can have a suitable thickness, for example, between 0.5 and 8 micrometers, and preferably between 1 and 5 micrometers. Then, a gold layer can be electroplated or electroless plated on the electroplated or electroless plated nickel layer in the openings 134a. In exemplary embodiments, the gold layer can have a suitable thickness, e.g., between 0.1 and 10 micrometers, and preferably between 0.5 and 5 micrometers.

Alternatively, the metal layer 136 can be composed of three (forming triple) metal layers formed by electroplating a copper layer having a suitable thickness, e.g., between 1 and 15 micrometers, between 5 and 50 micrometers or between 3 and 100 micrometers on the regions 132a of the seed layer 132. The previously-described copper layer can be used for the seed layer 132. The previously-described electroplating solution can be used for electroplating copper. Then a nickel layer having a suitable thickness, e.g., between 0.5 and 8 micrometers, and preferably between 1 and 5 micrometers, can be electroplated or electroless plated on the electroplated copper layer in the openings 134a. Next, a platinum layer having a suitable thickness, e.g., between 0.1 and 10 micrometers, and preferably between 0.5 and 5 micrometers, can be electroplated or electroless plated on the electroplated or electroless plated nickel layer in the openings 134a.

Alternatively, the metal layer 136 can be formed by electroplating a copper layer having a suitable thickness, e.g., between 1 and 15 micrometers, between 5 and 50 micrometers or between 3 and 100 micrometers, on the regions 132a of the seed layer 132. In exemplary embodiments, the previously-described copper layer can be used for the seed layer 132. Then, a nickel layer having a suitable thickness, e.g., between 0.5 and 8 micrometers, and preferably between 1 and 5 micrometers, can be electroplated or electroless plated on the electroplated copper layer in the openings 134a. Then, a platinum layer having a suitable thickness, e.g., between 0.1 and 10 micrometers, and preferably between 0.5 and 5 micrometers, can be electroplated or electroless plated on the electroplated or electroless plated nickel layer in the openings 134a. Next, a gold layer having a suitable thickness, e.g., between 0.1 and 10 micrometers, and preferably between 0.5 and 5 micrometers, can be electroplated or electroless plated on the electroplated or electroless plated platinum layer in the openings 134a.

Figure 2C:
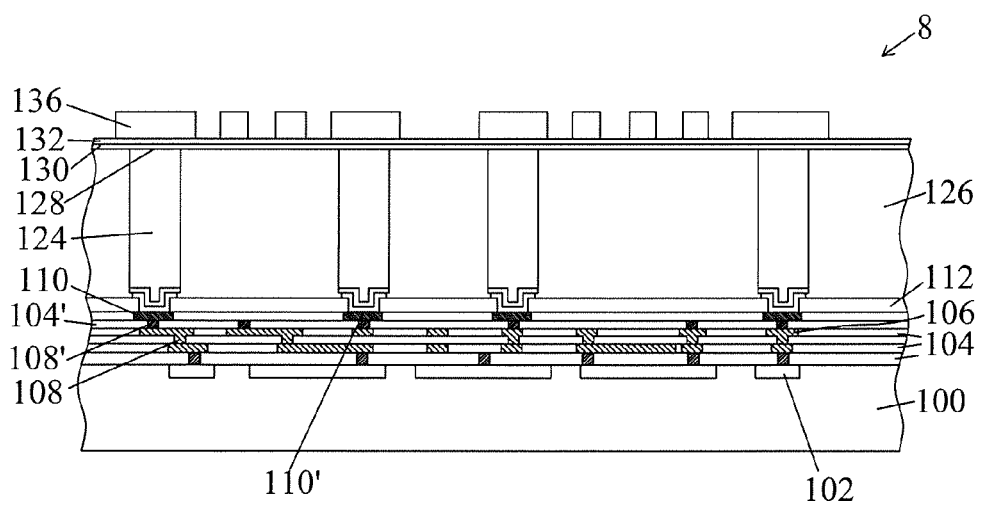
Figure 2D:
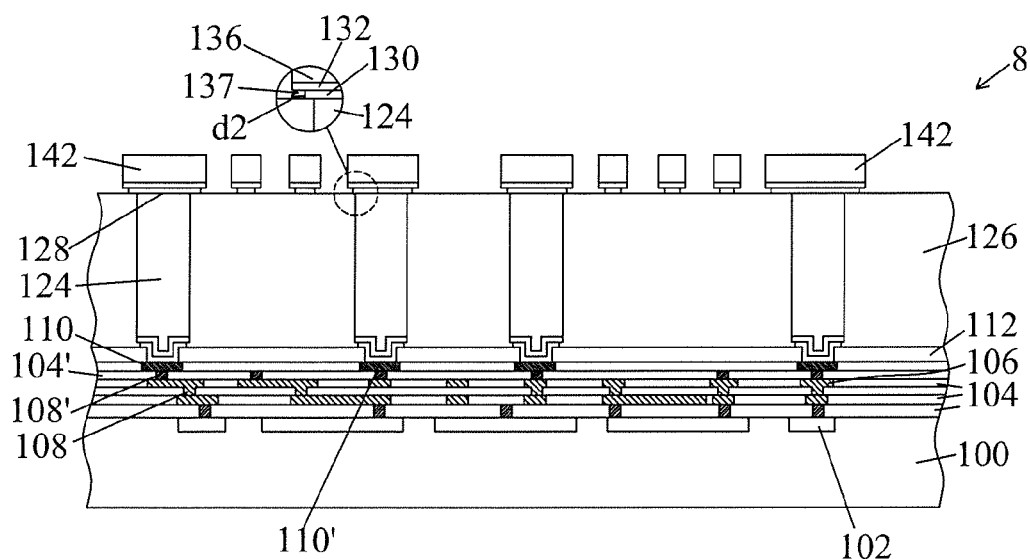
Figure 2E:
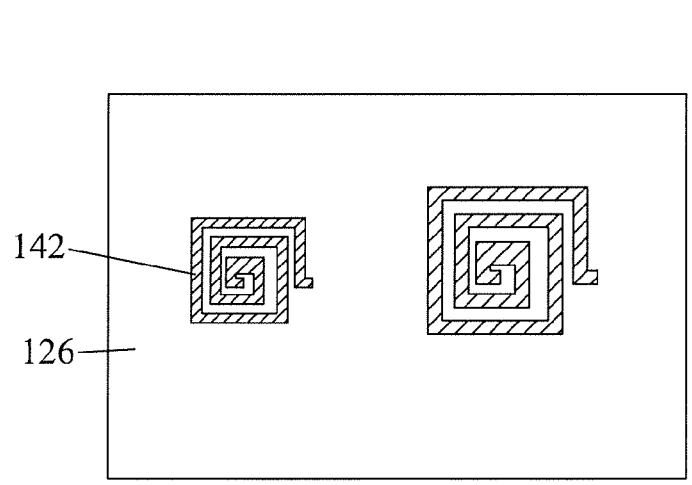

Next, referring to FIG. 2c, the patterned photoresist layer 134 can be removed. Referring to FIG. 2d, after removing the photoresist layer 134, the seed layer 132 not under (not covered by) the metal layer 136 can be removed by using a wet-etching process or a dry-etching process. After removing the seed layer 132 not under (not covered by) the metal layer 136, the adhesion/barrier layer 130 not under (not covered by) the metal layer 136, can then be removed by using a wet-etching process or a dry-etching process. The remaining metal layer 136 can be configured and used as desired, e.g., as an inductor configured as a coil 142. Referring to FIG. 2e, the coil 142 of the metal layer 136 can act as an inductor, as indicated.

After etching the seed layer 132 and the adhesion/barrier layer 130 not under the metal layer 136, an undercut 137 may be formed under the seed layer 132 and under the metal layer 136 when the adhesion/barrier layer 130 not under the metal layer 136 can be removed using a wet etching method. The adhesion/barrier layer 130 under the metal layer 136 can have a first sidewall recessed from a second sidewall of the seed layer 132. A distance, d2, between the first sidewall and the second sidewall can be selected as desired. In exemplary embodiments, d2, can be between 0.3 and 2 micrometers, as shown in FIG. 2d.

After etching the seed layer 136 and the adhesion/barrier layer 130 not under the metal layer 136, the other polymer layer (not shown) maybe formed on the metal layer 136 for protection.

The semiconductor wafer 100 can be cut into a plurality of individual semiconductor chips by a die-sawing process.

Figure 2F:
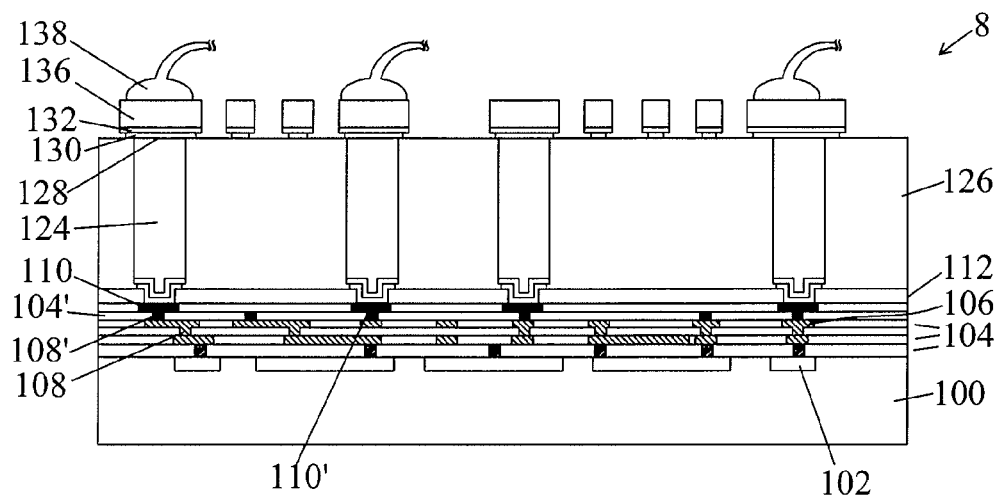

Referring to FIG. 2f, when the metal layer 136 includes an electroplating or electroless plating gold layer, copper layer or platinum layer, the metal layer 136 can be used as a wirebonded pad. The metal layer 136 can connect to external circuit through a bonded wire 138, such as gold wires or copper wires.

Embodiment 9

Figure 2G:
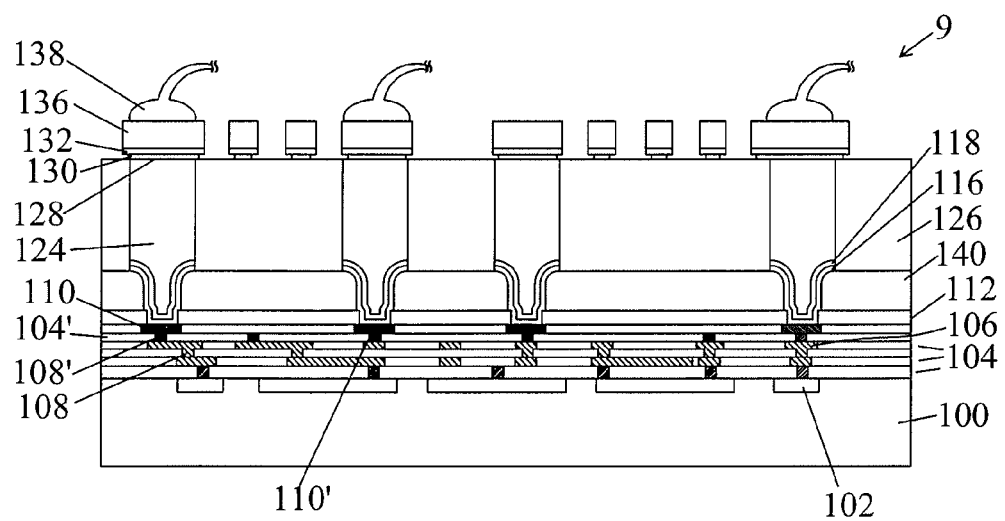
FIG. 2g is a cross-sectional view of a ninth embodiment, in accordance with the present disclosure.

FIG. 2g is a cross-sectional view of a ninth exemplary embodiment 9, in accordance with the present disclosure. The embodiment 9 is similar to the embodiment 8. FIG. 2g illustrates a final structure of the embodiment 9. A patterned polymer layer 140 can be formed on the passivation layer 112 before the adhesion/barrier layer 116 formed on the contact pads 110' exposed by the openings 114, on the passivation layer 112. Multiple openings 140a in the patterned polymer layer 140 can expose the contact pads 110' and passivation layer 112. The detailed process of the embodiment 8 is similar to the embodiment 1, and steps shown in FIGS. 1b-1p and FIGS. 2a-2f.

Embodiment 10

Figure 3A:
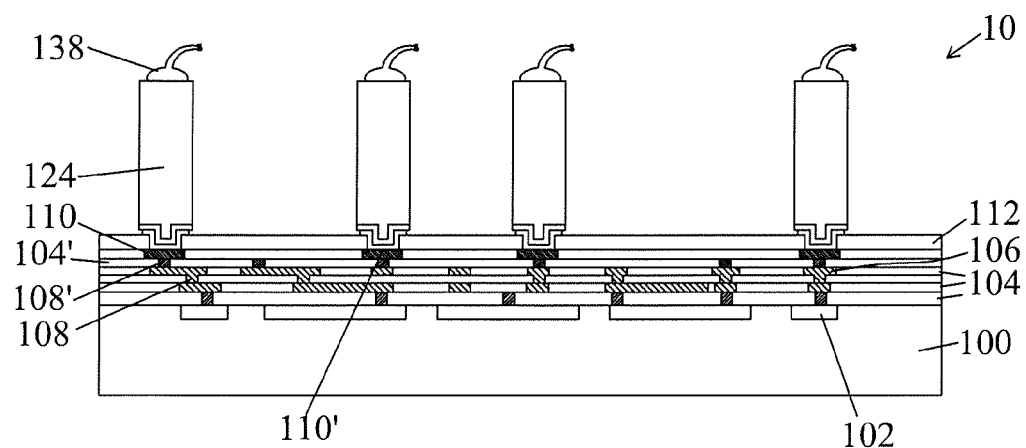
FIG. 3a is a cross-sectional view of a tenth embodiment, in accordance with the present disclosure.

FIG. 3a is a cross-sectional view of a tenth exemplary embodiment 10, in accordance with the present disclosure. After the steps illustrated in FIG. 1f, referring to FIG. 3a, the semiconductor wafer 100 can be cut into a plurality of individual semiconductor chips by a die-sawing process.

The top surface of metal pads or bumps or metal posts 124 can be used as wirebond pads. The metal pads or bumps or metal post 124 can connect to an external circuit (such as, printed circuit board (PCB) substrate, or Ball Grid Array (BGA) substrate) through one or more bonded wires 138, such as gold wires or copper wires.

Figure 3B:
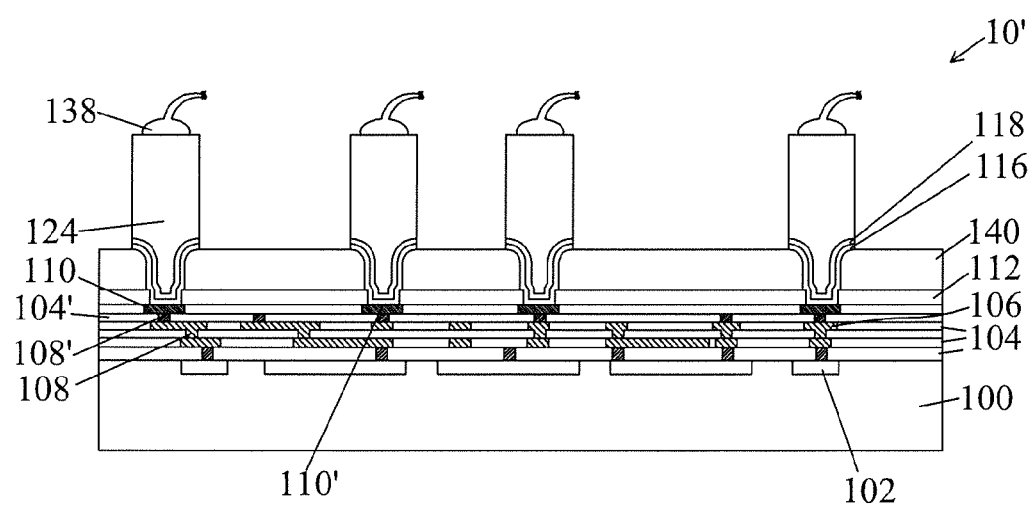

FIG. 3b is a cross-sectional view of a variation 10' of the embodiment shown in FIG. 3a. Referring to FIG. 3b, the structure is similar to the structure 10 of FIG. 3a, the different process is forming a patterned polymer layer 140 on the passivation layer 112 before the adhesion/barrier layer 116 formed on the contact pads 110' exposed by the openings 114, on the passivation layer 112. Multiple openings 140a in the patterned polymer layer 140 can expose the contact pads 110' and passivation layer 112. The detail process is similar to the embodiment 1, and steps shown in FIGS. 1b-1f.

Embodiment 11

Figure 3C:
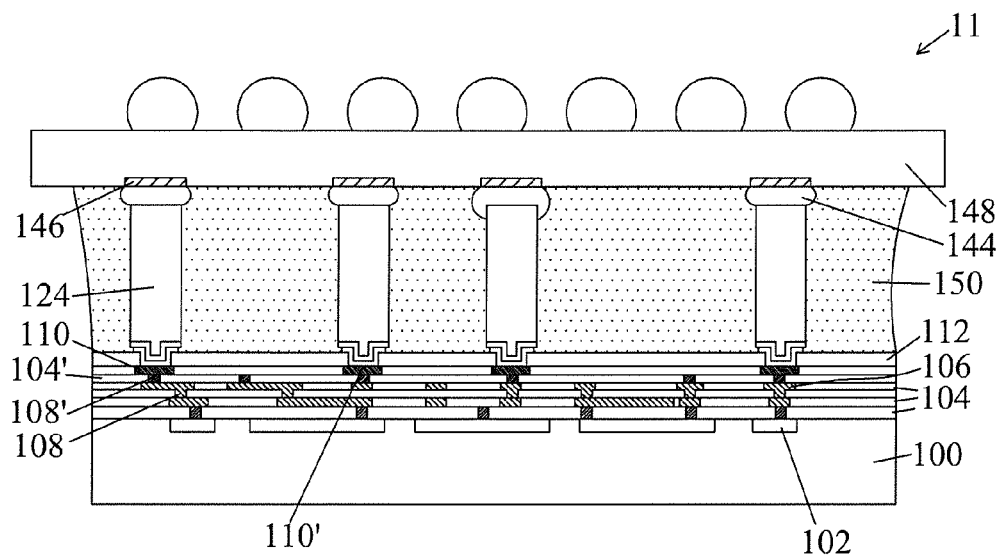
FIG. 3c is a cross-sectional view of an eleventh embodiment, in accordance with the present disclosure.

FIG. 3c is a cross-sectional view of an eleventh exemplary embodiment 11, in accordance with the present disclosure.

After the steps illustrated in FIG. 1f, referring to FIG. 3c, the semiconductor wafer 100 can be cut into a plurality of individual semiconductor chips by a die-sawing process.

The metal pads or bumps or metal posts 124 can be connected to solder balls 144 formed on a contact pad 146 of Ball Grid Array (BGA) substrate 148 by a flip chip process. Then, the metal pads or bumps or metal post 124 and solder ball 144 can be enclosed by underfill 150.

Figure 3D:
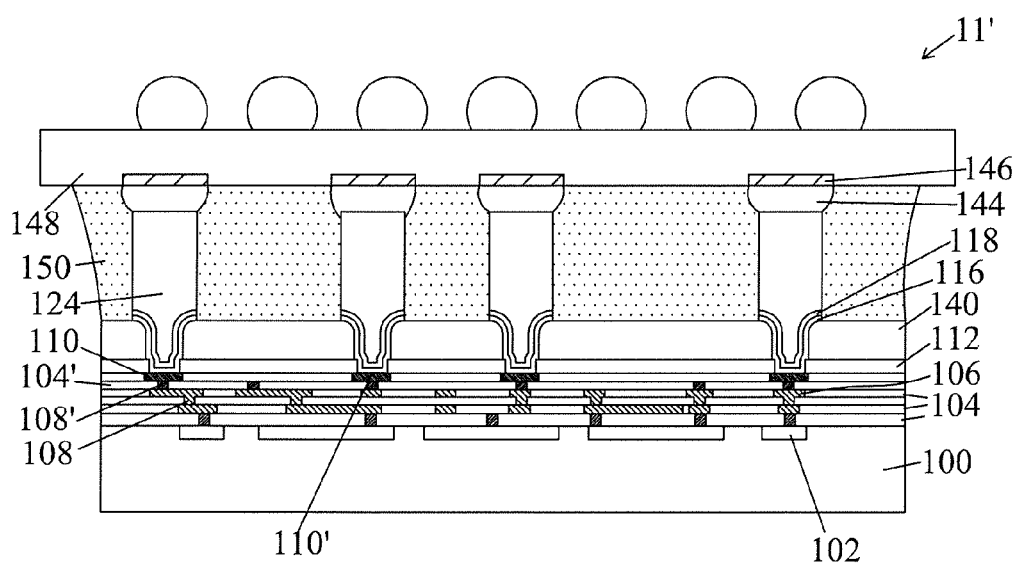
FIG. 3d is a cross-sectional view of a variation of the embodiment of FIG. 3c.

FIG. 3d is a cross-sectional view of a variation 11' of the embodiment of FIG. 3c. Referring to FIG. 3d, the structure is similar to the FIG. 3c, the different process is forming a patterned polymer layer 140 on the passivation layer 112 before the adhesion/barrier layer 116 formed on the contact pads 110' exposed by the openings 114, on the passivation layer 112. Multiple openings 140a in the patterned polymer layer 140 can expose the contact pads 110' and passivation layer 112. The detail process is similar to the embodiment 1, and processes shown in FIGS. 1b-1f.

Embodiment 12

Figure 4A:
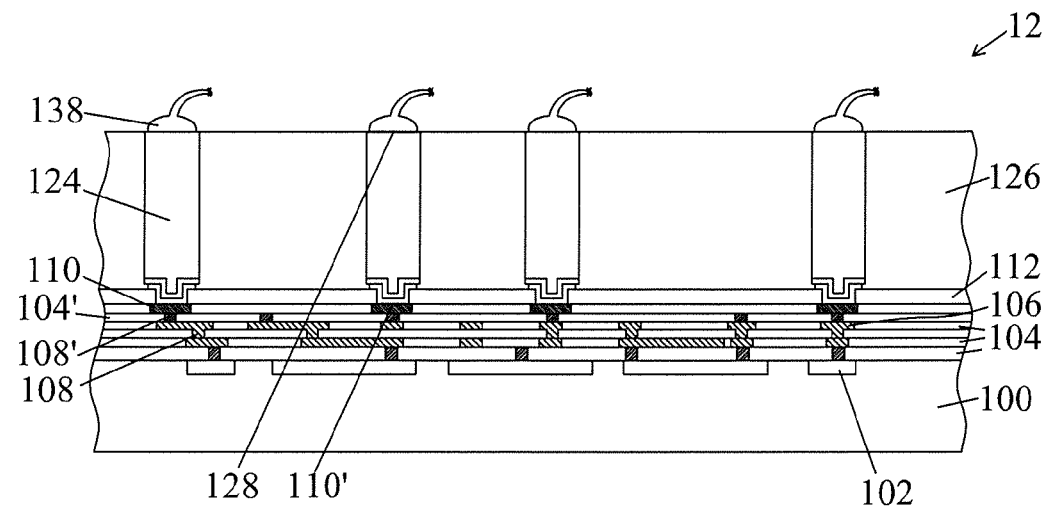
FIGS. 4a and 4b are cross-sectional views of a twelfth embodiment, in accordance with the present disclosure.
Figure 4B:
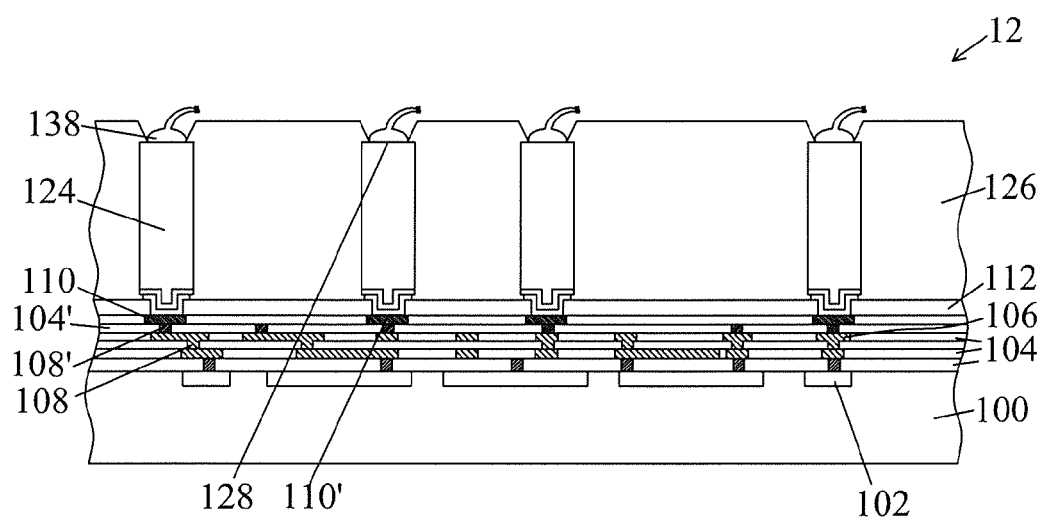

FIGS. 4a and 4b are cross-sectional views of a twelfth embodiment 12, in accordance with the present disclosure. After the steps illustrated in FIG. 1h or FIG. 1i, referring to FIG. 4a and FIG. 4b, the semiconductor wafer 100 can be cut into a plurality of individual semiconductor chips by a die-sawing process.

The contact pads 128 can be used as wirebond pads. The contact pads 128 can connect to an external circuit (such as, printed circuit board (PCB) substrate, or Ball Grid Array (BGA) substrate) through one or more bonded wires 138, such as gold wires or copper wires.

Figure 4C:
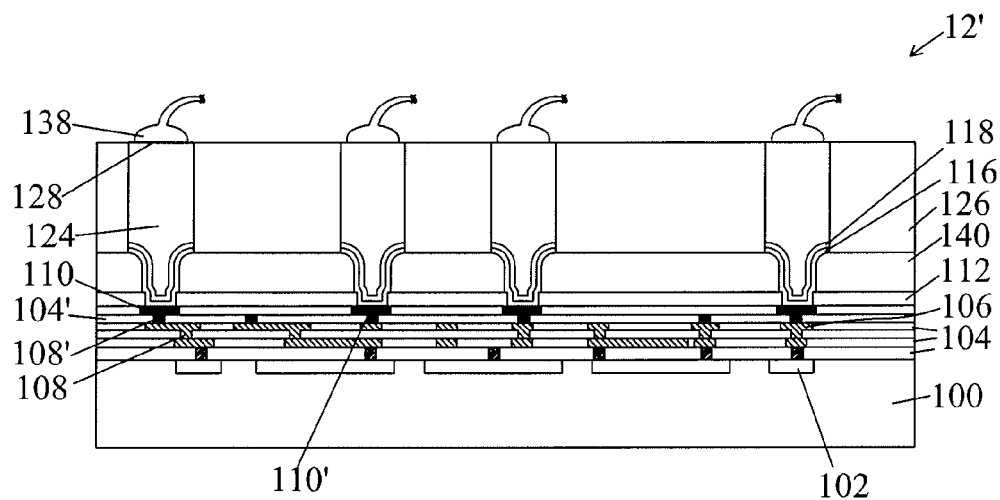
FIGS. 4c and 4d are cross-sectional views of variations of the embodiment of FIGS. 4a and 4b.
Figure 4D:
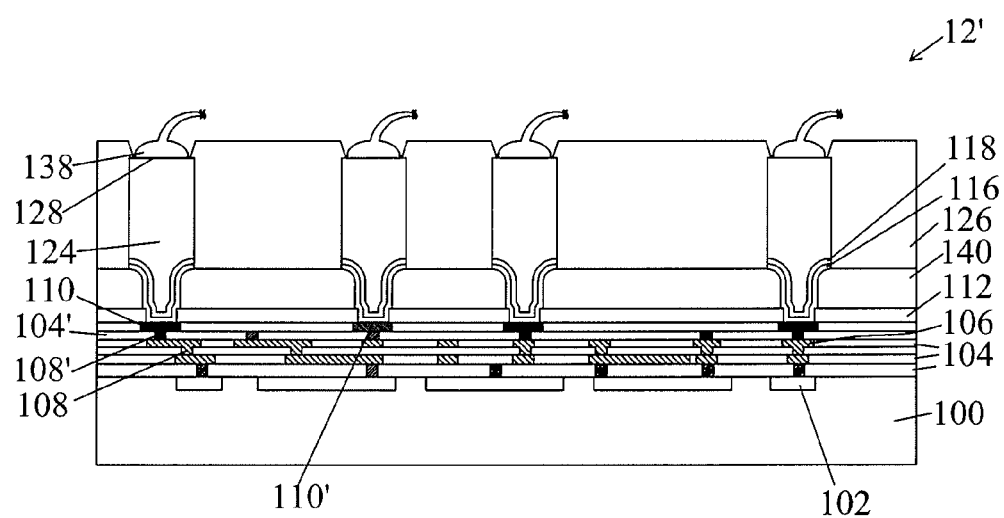

FIGS. 4c and 4d are cross-sectional view of variations 12' of the embodiment of FIGS. 4a and 4b. Referring to FIG. 4c and FIG. 4d, the structure is similar to the FIG. 4a and FIG. 4b, the different process is forming a patterned polymer layer 140 on the passivation layer 112 before the adhesion/barrier layer 116 formed on the contact pads 110' exposed by the openings 114, on the passivation layer 112. Multiple openings 140a in the patterned polymer layer 140 can expose the contact pads 110' and passivation layer 112. The detail process is similar to the embodiment 1, and steps shown in FIGS. 1b-1i and FIGS. 4a-4b.

Those described above are the embodiments to exemplify the present disclosure to enable the person skilled in the art to understand, make and use embodiments of the present disclosure. This description, however, is not intended to limit the scope of the present disclosure. Any equivalent modification and variation according to the spirit of the present disclosure is to be also included within the scope of the claims stated below.

The components, steps, features, benefits and advantages that have been discussed are merely illustrative. None of them, nor the discussions relating to them, are intended to limit the scope of protection in any way. Numerous other embodiments are also contemplated. These include embodiments that have fewer, additional, and/or different components, steps, features, benefits and advantages. These also include embodiments in which the components and/or steps are arranged and/or ordered differently.

In reading the present disclosure, one skilled in the art will appreciate that embodiments of the present disclosure can be implemented in hardware, software, firmware, or any combinations of such, and over one or more networks. Suitable software can include computer-readable or machine-readable instructions for performing methods and techniques (and portions thereof) of designing and/or controlling the fabrication and design of integrated circuit chips according to the present disclosure. Any suitable software language (machine-dependent or machine-independent) may be utilized. Moreover, embodiments of the present disclosure can be included in or carried by various signals, e.g., as transmitted over a wireless RF or IR communications link or downloaded from the Internet.

Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain. The scope of protection is limited solely by the claims. That scope is intended and should be interpreted to be as broad as is consistent with the ordinary meaning of the language that is used in the claims when interpreted in light of this specification and the prosecution history that follows and to encompass all structural and functional equivalents.

What is claimed is:

1. An integrated circuit chip comprising:
   a silicon substrate;
   multiple devices in and on said silicon substrate, wherein said multiple devices comprise a transistor;
   a first dielectric layer over said silicon substrate;
   a first metallization structure over said first dielectric layer, wherein said first metallization structure comprises a first metal layer and a second metal layer over said first metal layer;
   a second dielectric layer between said first and second metal layers;
   a passivation layer over said first metallization structure and over said first and second dielectric layers, wherein a first opening in said passivation layer is over a first contact point of said first metallization structure, and said first contact point is at a bottom of said first opening, and wherein a second opening in said passivation layer is over a second contact point of said first metallization structure, and said second contact point is at a bottom of said second opening;
   a first metal post on said first contact point, wherein said first metal post comprises a third metal layer on said first contact point and a copper layer having a thickness between 3 and 100 micrometers on said third metal layer;
   a second metal post on said second contact point, wherein a pitch between said first and second metal posts is between 25 and 100 micrometers; and
   a second metallization structure on a top surface of said first metal post and on a top surface of second metal post, wherein said second metallization structure comprises a tin-containing layer over said first and second metal posts.

2. The integrated circuit chip of claim 1 further comprising a polymer layer on said passivation layer, wherein said polymer layer contacts a sidewall of said copper layer.

3. The integrated circuit chip of claim 2, wherein said polymer layer has a thickness between 20 and 100 micrometers.

4. The integrated circuit chip of claim 1, wherein said tin-containing layer comprises silver.

5. The integrated circuit chip of claim 1, wherein said tin-containing layer is on a nickel layer of said second metallization structure.

6. The integrated circuit chip of claim 1, wherein said first metal layer comprises electroplated copper.

7. The integrated circuit chip of claim 1, wherein said first metal layer comprises electroplated copper and said second metal layer comprises an aluminum layer over said first metal layer.

8. The integrated circuit chip of claim 1, wherein said passivation layer comprises a nitride layer.

9. The integrated circuit chip of claim 1, wherein said passivation layer comprises a silicon-oxynitride layer.

10. The integrated circuit chip of claim 1, wherein said third metal layer comprises titanium.

11. The integrated circuit chip of claim 1, wherein said first and second metal posts are further on said passivation layer.

12. The integrated circuit chip of claim 1 further comprising a polymer layer on said passivation layer, wherein a third opening in said polymer layer is over said first contact point, and a fourth opening in said polymer layer is over said second contact point, wherein said first metal post is connected to said first contact point through said third opening, and said second metal post is connected to said second contact point through said fourth opening.

* * * * *